United States Patent
Unkrich

(10) Patent No.: US 7,586,392 B2
(45) Date of Patent: Sep. 8, 2009

(54) DUAL PATH ACOUSTIC DATA COUPLING SYSTEM AND METHOD

(75) Inventor: Mark A. Unkrich, Redwood City, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 227 days.

(21) Appl. No.: 11/338,222

(22) Filed: Jan. 23, 2006

(65) Prior Publication Data

US 2007/0171002 A1    Jul. 26, 2007

(51) Int. Cl.
*H01L 41/08* (2006.01)
*H03H 9/60* (2006.01)

(52) U.S. Cl. .................. 333/189; 310/317; 310/328

(58) Field of Classification Search ............... 333/189; 310/317, 328, 330–333; 367/13; 375/219, 375/285; 341/118, 120
See application file for complete search history.

(56) References Cited

U.S. PATENT DOCUMENTS

| | | | |
|---|---|---|---|
| 4,179,660 A * | 12/1979 | Zeis | ............. 375/238 |
| 4,748,419 A | 5/1988 | Somerville | |
| 4,835,486 A | 5/1989 | Somerville | |
| 5,384,808 A | 1/1995 | Van Brunt et al. | |
| 5,587,620 A | 12/1996 | Ruby et al. | |
| 5,594,705 A | 1/1997 | Connor et al. | |
| 5,703,573 A | 12/1997 | Fujimoto et al. | |
| 5,952,849 A | 9/1999 | Haigh | |
| 5,982,297 A | 11/1999 | Welle | |
| 6,107,721 A | 8/2000 | Lakin | |
| 6,108,376 A * | 8/2000 | Morgan et al. | ............. 375/239 |
| 6,124,756 A | 9/2000 | Yaklin et al. | |
| 6,215,375 B1 | 4/2001 | Larson, III et al. | |
| 6,262,600 B1 * | 7/2001 | Haigh et al. | ............. 326/82 |
| 6,262,637 B1 | 7/2001 | Bradley et al. | |
| 6,420,820 B1 | 7/2002 | Larson, III | |
| 6,424,237 B1 | 7/2002 | Ruby et al. | |

(Continued)

FOREIGN PATENT DOCUMENTS

EP            1050839            8/2000

(Continued)

OTHER PUBLICATIONS

Humad, Shweta, et al., High Frequency Micromechanical Piezo-on-Silicon Block Resonators, IEDM 03, pp. 957-960, IEEE, 2003.

(Continued)

*Primary Examiner*—Barbara Summons

(57) ABSTRACT

A data coupler includes first and second acoustic isolation transformers that develop first and second isolated output signals in response to first and second modulated input signals. A first and a second transmitter is coupled to the first and second acoustic isolation transformers to receive a first and a second data input signal and generate the first and second modulated input signal in response to the first and second data input signals. A first and a second receiver is coupled to the first and second acoustic isolation transformers to receive the first and a second isolated output signals and generate first and second demodulated signals responsive to the first and second isolated output signals. An output decision circuit is coupled to the first and second receivers to receive the first and second data output signals and generates a data output signal responsive to the first and second demodulated signals.

21 Claims, 10 Drawing Sheets

U.S. PATENT DOCUMENTS

| | | | |
|---|---|---|---|
| 6,469,597 | B2 | 10/2002 | Ruby et al. |
| 6,472,954 | B1 | 10/2002 | Ruby et al. |
| 6,483,229 | B2 | 11/2002 | Larson, III et al. |
| 6,525,566 | B2 | 2/2003 | Haigh et al. |
| 6,542,055 | B1 | 4/2003 | Frank et al. |
| 6,550,664 | B2 | 4/2003 | Bradley et al. |
| 6,566,979 | B2 | 5/2003 | Larson, III et al. |
| 6,617,249 | B2 | 9/2003 | Ruby et al. |
| 6,651,488 | B2 | 11/2003 | Larson, III et al. |
| 6,668,618 | B2 | 12/2003 | Larson, III et al. |
| 6,720,816 | B2 | 4/2004 | Strzalkowski |
| 6,787,048 | B2 | 9/2004 | Bradley et al. |
| 6,874,211 | B2 | 4/2005 | Bradley et al. |
| 6,874,212 | B2 | 4/2005 | Larson, III |
| 6,903,578 | B2 | 6/2005 | Haigh et al. |
| 6,927,651 | B2 | 8/2005 | Larson, III et al. |
| 6,946,928 | B2 | 9/2005 | Larson, III et al. |
| 6,954,121 | B2 | 10/2005 | Bradley et al. |
| 7,388,455 | B2 | 6/2008 | Larson, III |
| 2003/0128053 | A1 | 7/2003 | Haigh et al. |
| 2004/0207431 | A1 | 10/2004 | Haigh et al. |
| 2004/0239487 | A1* | 12/2004 | Hershbarger ........... 340/310.07 |
| 2005/0057277 | A1 | 3/2005 | Chen et al. |
| 2005/0093655 | A1* | 5/2005 | Larson et al. ............... 333/189 |
| 2007/0086274 | A1* | 4/2007 | Nishimura et al. .......... 367/140 |

FOREIGN PATENT DOCUMENTS

| | | |
|---|---|---|
| FR | 2679670 | 1/1993 |

OTHER PUBLICATIONS

Koc, Burhanettin, et al., A Circular Piezoelectric Transformer with Crescent Shape Input Electrodes, 1999 IEEE Ultrasonics Symposium, pp. 931-934, 1999.

Kwok, K.F., et al., General Study on Piezoelectric Transformer, Power Electronics Research Center, pp. 216-220, 2004.

Laoratanakul, Pital, et al., Unipoled Disk-type Piezoelectric Transformers, Jpn. J. Appl. Phys. vol. 41, pp. 1446-1450, 2002.

Piazza, Gianluca, et al., Voltage-Tunable Piezoelectrically-Transduced SIngle-Crystal SIlicon Resonators on SOI Substrate, IEEE, 2003.

Lineykin, Simon, et al., Feedback Isolation by Piezoelectric Transformers: Comparison of Amplitude to Frequency Modulation, 35th Annual IEEE Power Electronics Specialists Conference, pp. 1834-1840, 2004.

* cited by examiner

DATA_IN

V_MOD

V_DEM

DATA_OUT

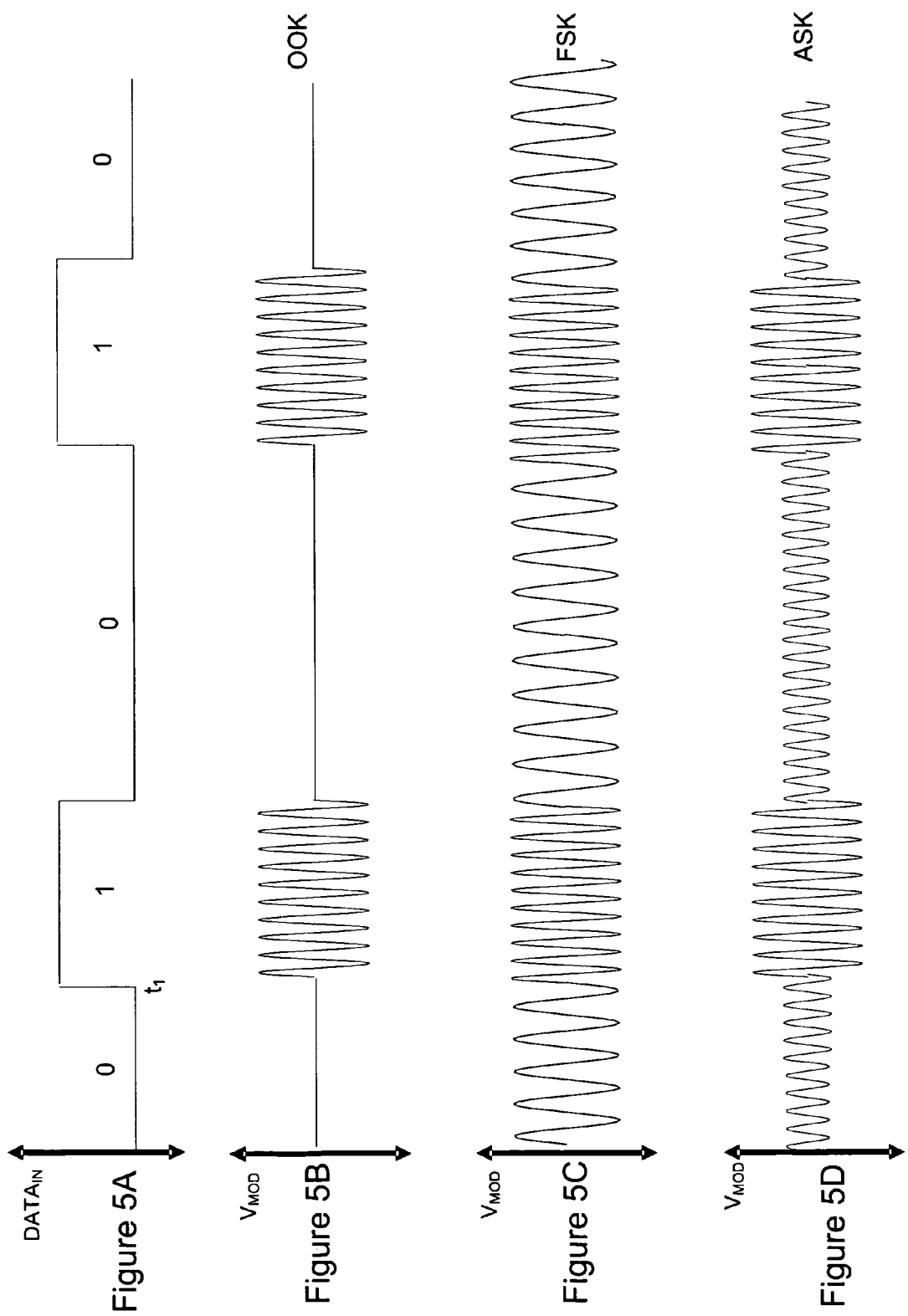

DUAL PATH ACOUSTIC DATA COUPLING SYSTEM AND METHOD

BACKGROUND OF THE INVENTION

Many electronic systems have a need to isolate electrical signals in one portion of the system from electrical signals in another portion of the system. In many control systems, for example, both high voltage and low voltage signals may be generated and monitored, and isolation between the signals is required for proper operation of the system. One reason such signals must be isolated is because the switching of high voltage signals can cause transients or noise on low voltage signals in the system. This noise on the low voltage signals, which would typically be digital logic level signals, can result in erroneous processing of the low voltage signals and thereby can result in improper operation of the overall system, as will be understood by those skilled in the art. Another reason for isolating signals may be safety, such as in medical systems where high higher voltages in portions of the system must be isolated from other portions that come into contact with a patient. In another situation, different grounds in different portions of a system need to be isolated from one another while allowing the communication of signals among the portions.

A variety of different devices and techniques have been utilized to communicate signals from one portion of a system to another portion of the system while maintaining isolation between the portions. Devices that provide this communication and isolation are generally referred to as data couplers. In operation, a data coupler receives an input electrical signal from a first portion of a system and converts this signal into a corresponding signal that is then communicated across an isolation barrier. The signal communicated across the isolation barrier is received and converted into an isolated output electrical signal that is then applied to a second portion of the system, with the received electrical signal corresponding to the input electrical signal from the first portion of the system.

Different types of data couplers use different types of isolation barriers to transfer or communicate signals from one portion of a system to another while maintaining electrical isolation between the portions. Each type of data coupler provides galvanic isolation between portions of the system, where galvanic isolation means the absence of any direct current (DC) path between the portions, as will be understood by those skilled in the art. Conventional data couplers utilize optical, magnetic, and capacitive isolation barriers to provide the required isolation and communication coupling path. For example, optical data couplers include an optical transmitter typically formed by a light emitting diode (LED) that receives an input electrical signal from a first portion of a system. The optical transmitter converts this signal into a corresponding optical signal that is communicated to an optical receiver, which is typically formed by a photodiode. In response to the received optical signal, the optical receiver generates a corresponding output electrical signal that is applied to a second portion of the system. In magnetic and capacitive data couplers, an input electrical signal is communicated through a transformer and capacitors, respectively, to provide a corresponding output signal, with the transformer and capacitors respectively providing the desired isolation between the input and output signals.

An acoustic data coupler includes piezoelectric elements coupled together through an acoustic coupling medium. The acoustic coupling medium acoustically couples the piezoelectric elements to one another and also provides the desired electrical isolation between the elements, with one element being coupled to a first portion of a system and the other element being coupled to a second portion of the system. In response to an input signal from the first portion, the first piezoelectric element generates an acoustic wave that propagates through the acoustic coupling medium to the second piezoelectric element. Responsive to the acoustic wave, the second piezoelectric element generates an output electrical signal that is applied to the second portion of the system.

The input signal applied to an acoustic data coupler is typically a digital signal having rising and falling edges that define bits of data being communicated by the signal. The precise manner in which transitions in the input signal are converted into a signal that is applied to the first piezoelectric element affects the overall operation, performance, and cost of the coupler. Moreover, while acoustic data couplers can potentially be utilized in a wide array of applications, improvements in existing couplers in terms of cost, data rates, and power consumption are needed. Another limitation with existing acoustic data couplers is channel density, meaning the size of existing couplers may be too large to allow the required numbers of couplers to be formed within a maximum specified space. Magnetically and capacitively isolated data couplers are further limited by susceptibility to external electromagnetic interference signals increasing the noise received in addition to the desired transmitted signal across the magnetic or capacitive isolation barrier. Acoustic data couplers rely upon acoustic waves between the piezoelectric elements rather than magnetic or capacitive coupling and have increased immunity allowing further improvements in performance and power consumption.

There is a need for circuits and methods for acoustic data couplers that improve the cost, data rate, power consumption, external electromagnetic noise immunity, and channel density or size of such couplers.

SUMMARY OF THE INVENTION

According to one aspect of the present invention, a data coupler includes a first acoustic isolation transformer operable to develop a first isolated output signal in response to a first modulated input signal. A second acoustic isolation transformer is operable to develop a second isolated output signal in response to a second modulated input signal. A first transmitter is coupled to the first acoustic isolation transformer to receive a first data input signal and is operable to generate the first modulated input signal in response to the first data input signal. A second transmitter is coupled to the second acoustic isolation transformer to receive a second data input signal that is the complement of the first data input signal. The second transmitter is operable to generate the second modulated input signal in response to the second data input signal. A first receiver is coupled to the first acoustic isolation transformer to receive the first isolated output signal and is operable to generate a first demodulated signal responsive to the first isolated output signal. A second receiver is coupled to the second acoustic isolation transformer to receive the second isolated output signal and is operable to generate a second demodulated signal responsive to the second isolated output signal. An output decision circuit is coupled to the first and second receivers to receive the first and second data output signals and is operable to generate a data output signal responsive to the first and second demodulated signals.

BRIEF DESCRIPTION OF THE DRAWINGS

FIGS. 5A-5D are signal diagrams illustrating the modulated signal developed by the transmitter of FIG. 1 according to different respective embodiments of the present invention.

DETAILED DESCRIPTION OF PREFERRED EMBODIMENTS

Figure 1:
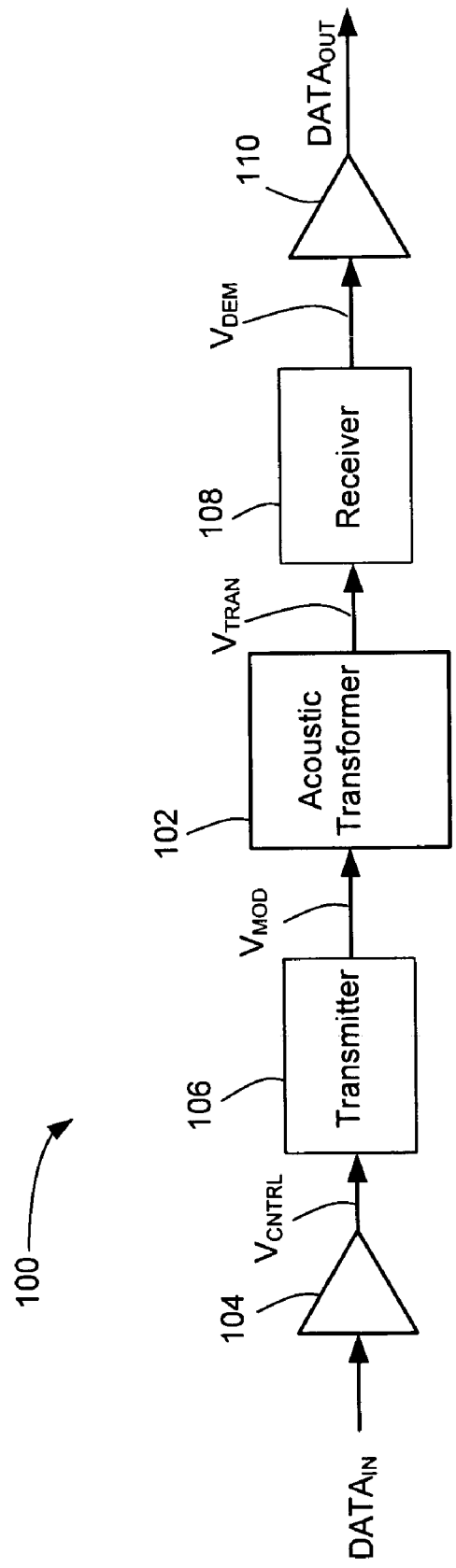
FIG. 1 is a functional block diagram of an acoustic data coupler including an acoustic isolation transformer according to one embodiment of the present invention.

FIG. 1 is a functional block diagram of an acoustic data coupler 100 including an acoustic isolation transformer 102 according to one embodiment of the present invention. In operation, a digital data input signal $DATA_{IN}$ is applied through an input buffer 104 to generate an input control signal $V_{CNTRL}$, which is applied to a transmitter 106. In response to the input control signal $V_{CNTRL}$ from the input buffer 104, the transmitter 106 generates a modulated signal $V_{MOD}$, which may be a continuous periodic signal, burst periodic signal, or burst nonperiodic signal, as will be discussed in more detail below. In response to the modulated signal $V_{MOD}$, the acoustic isolation transformer 102 generates a transformer output signal $V_{TRAN}$ that is utilized in generating a data output signal $DATA_{OUT}$ from the data coupler 100. The way in which the transmitter 106 converts or modulates the $DATA_{IN}$ signal to generate the modulated signal $V_{MOD}$ that is applied to the acoustic isolation transformer 102 improves the overall operation, performance, channel density, and cost of the data coupler 100, as will also be explained in more detail below. With the acoustic isolation transformer 102, the data coupler 100 provides good immunity from electromagnetic interference and the type of modulation utilized by the transmitter 106 allows various parameters of the data coupler such as the power consumption to be optimized.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention.

The acoustic data coupler 100 further includes a receiver 108 that receives the transformer output signal $V_{TRAN}$ from the acoustic isolation transformer 102 and demodulates the signal to generate a demodulated signal $V_{DEM}$. The type of demodulation performed by the receiver 108 depends, of course, upon the type of modulation utilized by the transmitter 106. An output buffer 110 receives the demodulated signal $V_{DEM}$ from the receiver 108 and generates a data output signal $DATA_{OUT}$ in response to the demodulated signal, with the data output signal corresponding to the originally applied data input signal $DATA_{IN}$.

In operation, the data input signal $DATA_{IN}$ received from a first portion of a system (not shown) represents data to be transferred from the first portion to a second portion of the system (not shown), where the first and second portions must be electrically isolated from one another. The data input signal $DATA_{IN}$ is applied through the input buffer 104 to generate the input control signal $V_{CNTRL}$ that is applied to the transmitter 106. The transmitter 106 modulates a carrier signal responsive to the input control signal $V_{CNTRL}$ and outputs the modulated carrier signal as the modulated signal $V_{MOD}$. The type of modulation utilized by the transmitter 106 varies in different embodiments of the present invention, as will be described in more detail below.

In response to the modulated signal $V_{MOD}$, first piezoelectric elements (not shown) in the acoustic isolation transformer 102 generate acoustic waves that are a function of the modulated signal. These acoustic waves propagate through an acoustic coupling medium or layer (not shown) and are received by second piezoelectric elements (not shown) in the acoustic isolation transformer 102. In response to the acoustic waves, the second piezoelectric elements of the acoustic isolation transformer develop an isolated output signal referred to as the transformer output signal $V_{TRAN}$, with the transformer output signal being a function of the acoustic waves which, in turn, are a function of the modulated signal $V_{MOD}$ such that the transformer output signal is a function of the modulated signal.

The receiver 108 demodulates the transformer output signal $V_{TRAN}$ to generate the demodulated signal $V_{DEM}$, which represents the original data input signal $DATA_{IN}$ applied to the transmitter 106. The output buffer 110 provides the $DATA_{OUT}$ signal in response to the demodulated signal $V_{DEM}$, with the $DATA_{OUT}$ signal corresponding to the $DATA_{IN}$ signal while being electrically isolated from that signal. The $DATA_{OUT}$ signal is applied to the second portion of the system (not shown) containing the acoustic data coupler 100.

Acoustic isolation transformers 102 provide many advantages over optical, magnetic, and capacitive isolation barriers in data coupler devices. Key differentiators in the design of data couplers include size, cost, data rate, power consumption, channel density, and immunity to external electromagnetic interference. Acoustic isolation transformers have a number of advantages to optimize tradeoffs between these parameters and improvement performance of the data coupler device. The high Q nature of the piezoelectric resonators allows very low power oscillators while the bandwidth of the acoustic isolation transformer typically scales with the resonant frequency of the transformer, allowing relatively simple modulation schemes to provide data rates at hundreds of megahertz (MHz). The acoustic data coupler isolation barrier relies upon acoustic energy rather than electromagnetic energy and is therefore relatively immune to external electromagnetic fields compared to magnetic or capacitive isolation barriers. This reduces one of the constraints on the signal levels utilized in the transmission of data through the acoustic isolation transformer. The acoustic isolation transformers are inherently frequency bandpass devices. Noise energy outside the passband of the transformer is significantly reduced by this filtering of the noise through the acoustic isolation transformer. Good common mode rejection design of the acoustic isolation transformer is also effective at providing rejection of the respective ground noise between the data input and data output nodes.

Utilizing these improvements, the signal levels through the acoustic isolation transformer are minimized to improve power consumption of the transmitter and receiver while maintaining signal to noise performance to minimize erroneous data transmission signaling. Magnetic transformers, for example, are further limited in size and channel density due to the cross coupling of different channel's magnetic fields limiting the proximity of one transformer to another on a monolithic substrate. Acoustic isolation transformers do not rely upon magnetic coupling and are readily acoustically isolated when constructed on the same substrate, allowing high channel density and small size. Similar advantages in channel density apply relative to optically or capacitively isolated data coupler devices. These advantages in size, channel density, power consumption, and data rates translate into cost savings in the manufacturing and integration of acoustic data coupler devices.

Figure 2:
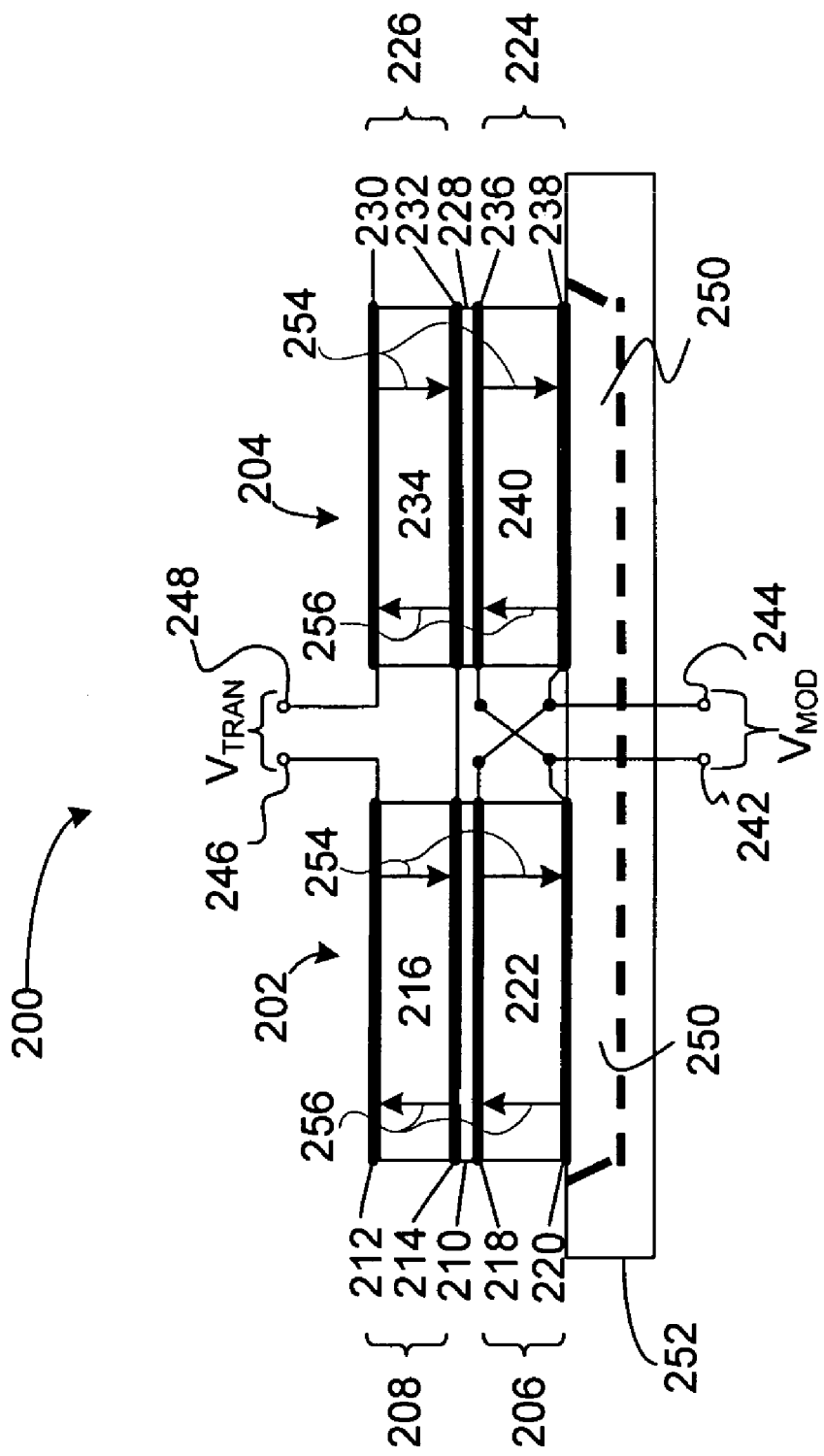
FIG. 2 is a more detailed cross-sectional view of the acoustic isolation transformer of FIG. 1 according to one embodiment of the present invention.

FIG. 2 is a more detailed cross-sectional view of an acoustic isolation transformer 200 that corresponds to the acoustic isolation transformer 102 of FIG. 1 according to one embodiment of the present invention. In this embodiment, the acoustic isolation transformer 200 is composed of two stacked film bulk acoustic resonators (SBARs) 202 and 204. The SBAR 202 includes a stacked pair of film bulk acoustic resonators (FBARs) 206 and 208 with an acoustic coupling layer 210 positioned between them. More specifically, the FBAR 208 is stacked atop FBAR 206, and includes planar electrodes 212 and 214 formed on top and bottom, respectively, of a piezoelectric material 216. The FBAR 206 similarly includes planar electrodes 218 and 220 formed on the top and bottom, respectively, of a piezoelectric material 222. The SBAR 204 similarly includes a stacked pair of FBARs 224 and 226 with an acoustic coupling layer 228 positioned between them. The acoustic coupling layers 210 and 228 acoustically couple FBARs 206, 208 and FBARs 224, 226 while providing the desired electrical isolation between these pairs of FBARs.

The FBAR 226 is stacked atop FBAR 224 and includes planar electrodes 230 and 232 formed on top and bottom, respectively, of a piezoelectric material 234, and FBAR 224 similarly includes planar electrodes 236 and 238 formed on the top and bottom, respectively, of a piezoelectric material 240. As will be appreciated by those skilled in the art, each of the piezoelectric layers 216, 222, 234, and 240 has an associated orientation of the crystal structure forming the layer, which is indicated by arrows 254 and 256 in FIG. 2. With the acoustic isolation transformer 200 the piezoelectric layers 216, 222, 234, and 240 have the same orientation of their respective crystal structures, and thus all would have either orientations indicated by arrows 254 or orientations indicated by arrows 256.

In the embodiment of FIG. 2, the FBARs 206 and 224 are electrically interconnected in antiparallel as shown, and have input terminals 242 and 244 that receive the modulated signal $V_{MOD}$. More specifically, the terminal 244 is connected to the top electrode 218 of the FBAR 206 which, in turn, is electrically connected to the bottom electrode 238 of the FBAR 224. The terminal 242 is connected to the top electrode 236 of the FBAR 224 which, in turn, is electrically connected to the bottom electrode 220 of the FBAR 206. The FBARs 208 and 226 are electrically interconnected in series and have a pair of output terminals 246 and 248 across which the transformer output signal $V_{TRAN}$ is developed. More specifically, the bottom electrode 214 of the FBAR 208 is electrically connected to the bottom electrode 232 of the FBAR 226 and the top electrode 212 of the FBAR 208 corresponds to the output terminal 246 while the top electrode 230 of the FBAR 226 corresponds to the output terminal 248.

In the acoustic isolation transformer 200, the SBARs 202 and 204 are suspended over a cavity 250 defined in a substrate 252. Suspending the SBARs 202 and 204 over the cavity 250 isolates the resonance of the FBARs 206, 208, 224, and 226 of these SBARs from the substrate 252. Other isolation schemes that isolate the resonance of the FBARs 206, 208, 224, and 226 from the substrate are possible, such as those disclosed in U.S. Pat. No. 6,107,721 to Lakin and U.S. Pat. No. 5,587,620 to Ruby et al., which are also incorporated herein by reference.

In operation of the acoustic isolation transformer 200, the modulated signal $V_{MOD}$ is applied across the input terminals 242 and 244 and in response to this signal the piezoelectric material 222 in the FBAR 206 and piezoelectric material 240 in FBAR 224 generate acoustic waves. These acoustic waves propagate through the respective acoustic coupling layers 210 and 228 and into the piezoelectric materials 216 and 234 of the FBARs 208 and 226, respectively. These acoustic waves cause mechanical oscillation of the piezoelectric materials 216 and 234, and oscillation is converted into electrical energy in the form of the transformer output signal $V_{TRAN}$ across the output terminals 246 and 248. The detailed theory of operation of various suitable embodiments of the acoustic isolation transformer 200 are described in the above incorporated references and thus, for the sake of brevity, will not be described in more detail.

Note that in alternative embodiments of the acoustic isolation transformer 200, the electrical interconnections between the FBARs 206 and 224 and the electrical interconnections between the FBARs 208 and 226 are varied. For example, in another embodiment the FBARs 206 and 224 are connected in series while the FBARs 208 and 226 are connected in antiparallel, which is analogous to making terminals 246 and 248 the input terminals in the embodiment and terminals 242 and 244 the output terminals in the embodiment of FIG. 2. In general, many particular embodiments of the acoustic isolation transformer 200 allow the interchange of the use of the terminal pairs as either input terminals or output terminals, as will be appreciated by those skilled in the art.

Alternative embodiments of the acoustic isolation transformer 200 are described in more detail in U.S. Pat. Nos. 6,954,121, 6,946,928, 6,927,651, 6,874,212, 6,874,211, 6,787,048, 6,668,618, 6,651,488, 6,617,249, 6,566,979, 6,550,664, 6,542,055, 6,483,229, 6,472,954, 6,469,597, 6,424,237, 6,420,820, 6,262,637, 6,215,375, to Larson et al., all of which are incorporated herein by reference. In sum, the acoustic isolation transformer 200 of FIG. 2 is illustrated merely to show in more detail one embodiment of the acoustic isolation transformer 102 of FIG. 1. This description and illustration of the acoustic isolation transformer 200 is not intended to limit the type of acoustic isolation transformer that can be used in the acoustic data coupler 100 of FIG. 1.

The acoustic isolation transformer 102 need not include stacked FBARs as in the embodiment of FIG. 2 and as described above, but instead may include other known acoustic isolation transformer structures. For example, the stacked FBARs utilize a thickness expansion mode of vibration in operation, while other structures of acoustic isolation transformers utilize flexural, length, area expansion, thickness shear, surface acoustic wave, or contour-expansion vibration modes during operation. Other vibration modes of operation may also be utilized in further structures of the acoustic isolation transformer 102. Furthermore, various types of piezoelectric materials can be utilized in various embodiments of the acoustic isolation transformer 200, such as AlN, ZnO, and PZT, for example.

In some embodiments of the acoustic isolation transformer 102, two acoustic transformers are utilized to provide overall differential operation and thereby provide increased noise rejection between the input and output ground references. For example, in the embodiment of FIG. 2 each stacked film bulk acoustic resonator (SBAR) 202 and 204 is itself an acoustic transformer, with the two transformers being differentially interconnected. Two such differentially interconnected acoustic transformers may be utilized in any of the above described embodiments utilizing the various vibration modes of operation in order to realize the increased noise rejection provided by such a differential interconnection.

It should also be noted that for some embodiments of the acoustic isolation transformer 102, a separate acoustic coupling layer such as the acoustic coupling layers 210 and 228 (FIG. 2) may not be required. Instead, in some embodiment the piezoelectric material itself may perform the acoustic coupling and electrical isolation function provided by an acoustic coupling layer. For example, an input transducer may be formed on a first portion of a piezoelectric layer and an output transducer formed on a second portion of the same piezoelectric layer that is physically separated from the first portion. In such an embodiment, the particular vibration mode being utilized propagates via the piezoelectric layer from the input to the output transformer while the piezoelectric layer also provides the desired electrical isolation between the input and output transformers without the need of any separate acoustic coupling layer. In sum, any other existing structure, such as series-connected transformers or combinations of series-connected and parallel-connected transformers, or any future developed structure of acoustic isolation transformer may be used as the acoustic isolation transformer 102 in the data coupler 100 of FIG. 1 and the acoustic isolation transformer 200 of FIG. 2, with the transformer 200 merely being one example embodiment of the transformer 102.

The acoustic isolation transformer 200 is a differential acoustic transformer formed by two individual transformers corresponding to the SBARs 202 and 204. Other differential acoustic transformer structures for the acoustic isolation transformer 102 (FIG. 1) are of course possible, as mentioned above. Note that any such differential acoustic transformers, such as the transformer 200, may be viewed as a single transformer including two input transducers and two output transducers, with each pair of one input and one output transducer functioning as an individual acoustic transformer. These individual acoustic transformers are then interconnected as desired to form the differential acoustic transformer. For example, in the transformer 200 of FIG. 2 each FBAR 206 and 224 may be termed an input transducer and each FBAR 208 and 226 termed an output transducer. Each pair of input and output transducers, namely the pair of transducers 206 and 208 and the pair of transducers 224 and 226 thus forms a respective transformer corresponding to the SBARs 202 and 204 in the embodiment of FIG. 2.

It should be noted that the term differential acoustic transformer as used herein is used broadly and is intended to cover any structure of such a transformer regardless of how many input and output transducers the transformer includes. In some embodiments, a single input transducer could be physically split into two or multiple transducer portions, and the same is true for a single output transducer. Depending upon the vibration mode of operation, each portion of the input transducer could transmit signals to multiple portions of the output transducer with the overall structure still being operated in a differential manner with the full benefits of differential performance. In this case, however, one input transducer portion and one output transducer portion do not form an "isolated" transformer due to the cross coupling between the portions. Once again, as used herein the term differential acoustic transformer is intended to cover any suitable structure regardless of the number of input and output transducers.

Figure 3:
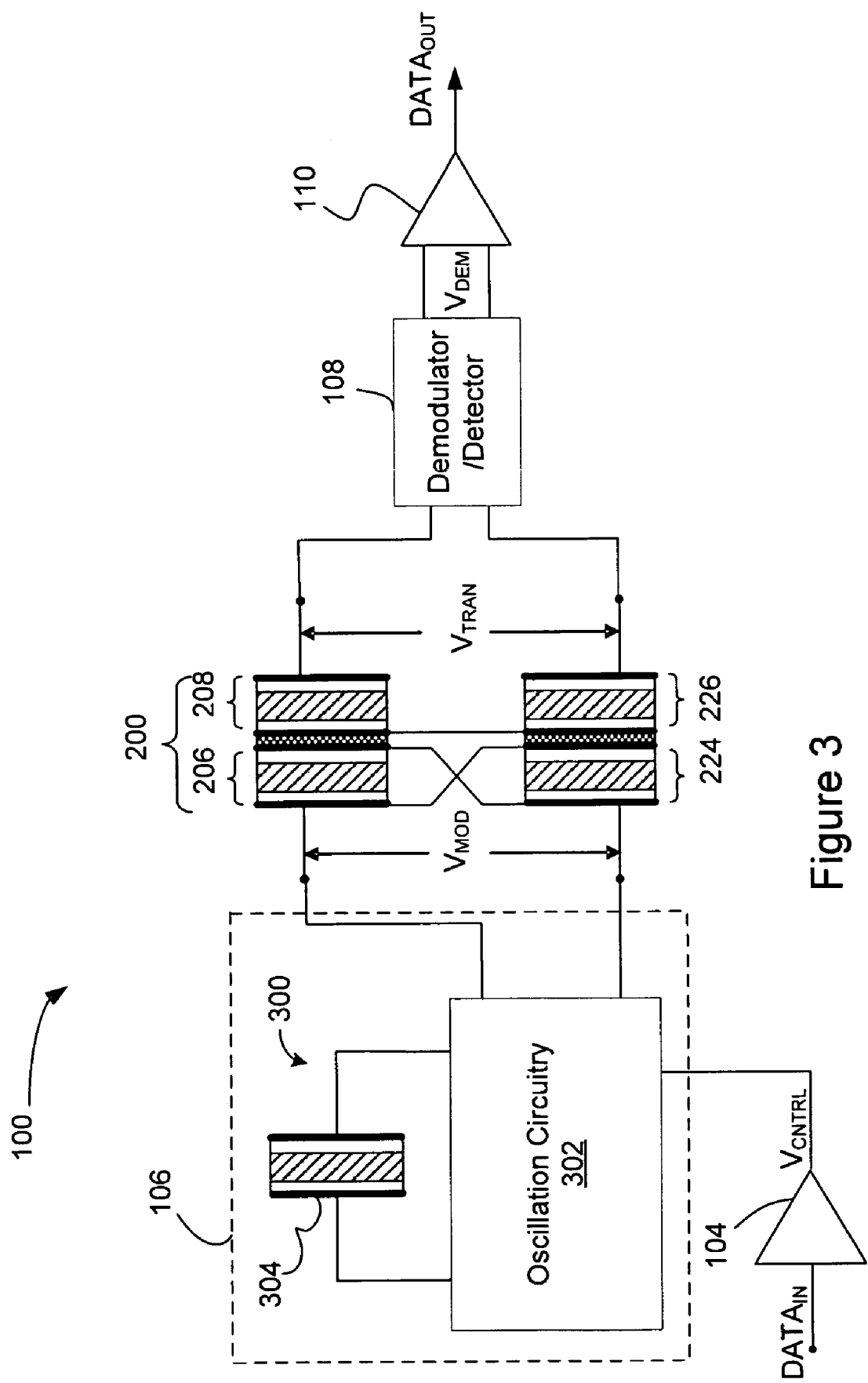
FIG. 3 is a functional block diagram of the acoustic data coupler of FIG. 2 showing in more detail the transmitter of FIG. 1 according to one embodiment of the present invention.

FIG. 3 is a functional block diagram of the acoustic data coupler 100 of FIG. 1 showing in more detail the transmitter 106 of FIG. 2 according to one embodiment of the present invention. Components common to FIGS. 2 and 3 have been given the same reference numbers. In the embodiment of FIG. 3, the transmitter 106 will first be described as implementing On/Off Keying (OOK) modulation of the applied input control signal $V_{CNTRL}$. To implement OOK modulation, the transmitter 106 includes an oscillator 300 formed by oscillation circuitry 302. The frequency of oscillation of an oscillator may be determined by many different design parameters depending upon the oscillator architecture and the system requirements. In systems requiring tight control on the oscillation frequency, a crystal resonator is typically utilized to provide a stable operating frequency due to the frequency response of the magnitude and phase of the resonator. In the embodiment of the oscillator 300, FBAR 304 functions as this resonator. The oscillation circuitry 302 receives the $V_{CNTRL}$ from the input buffer 104 in response to the $DATA_{IN}$ signal applied to the input buffer. In response to the $V_{CNTRL}$ signal, the oscillation circuitry 302 generates the $V_{MOD}$ signal that is applied to the acoustic isolation transformer 200. Note that the oscillator 300 may be any suitable type of oscillator, such as a Pierce or Colpitts oscillator, with the specific structure of the oscillation circuitry 302 varying to form the desired type of oscillator.

The operation of the transmitter 106 in implementing OOK modulation and the overall operation of the acoustic data coupler 100 of FIG. 3 will now be described in more detail with reference to the signal diagrams of FIG. 4A-D. In operation of the transmitter 106, the oscillator 300 generates a periodic signal which is generally sinusoidal for the $V_{MOD}$ signal, with the sinusoidal signal having a frequency corresponding to a resonance frequency of the FBAR 304. As previously mentioned, different types of oscillators may form the oscillator 300 and the theory and detailed operation of such different types of oscillators will be understood by those skilled in the art, and thus, for the sake of brevity, will not be described in detail.

In the oscillator 300, the FBAR 304 is. constructed similarly as the FBARs 206, 208, 224, and 226 in the acoustic isolation transformer 200. As a result, in the OOK embodiment being described the oscillator 300 generates a sinusoidal signal within the passband of the acoustic isolation transformer 200 formed with FBARS 206, 208, 224, and 226, which is required for efficient operation of the transformer. In one embodiment, the FBAR 304 is formed on a common substrate (not shown) with the FBARs 206, 208, 224, and 226 of the acoustic isolation transformer 200. Forming all these FBARs on the same substrate and during the same manufacturing process ensures that the characteristics of each FBAR are as nearly identical as possible. Moreover, by placing these FBARs on the same substrate variations in the characteristics of the FBARs that occur during operation of the acoustic data coupler, such as variations in temperature and the previously mentioned variations in the manufacturing process, will be consistent among the FBARs. These variations among the FBARs will thus track each other. For example, if a temperature increase or process variation causes an increase in the resonant frequency of the FBARs 206, 208, 224, and 226, the resonant frequency of the FBAR 304 will also increase, causing the frequency of the $V_{MOD}$ signal to track the changes in resonant frequencies of the FBARs in the acoustic isolation transformer 200.

Figure 4A:
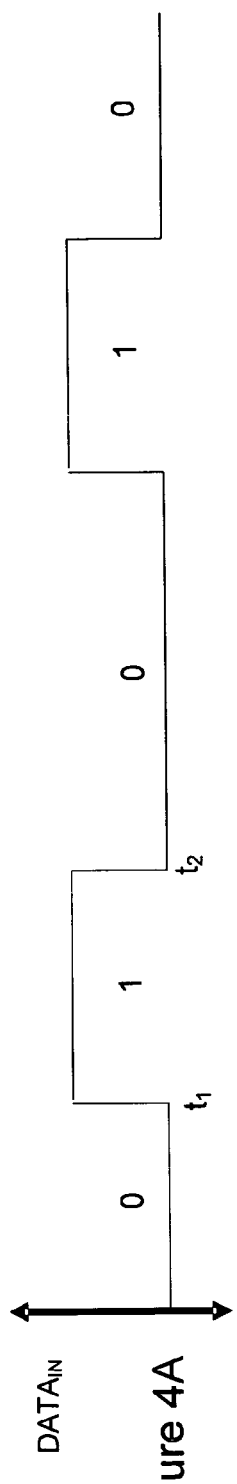
FIGS. 4A-4D are signal diagrams illustrating signals at various points in the acoustic data coupler of FIG. 3 during operation of the data coupler.
Figure 4B:
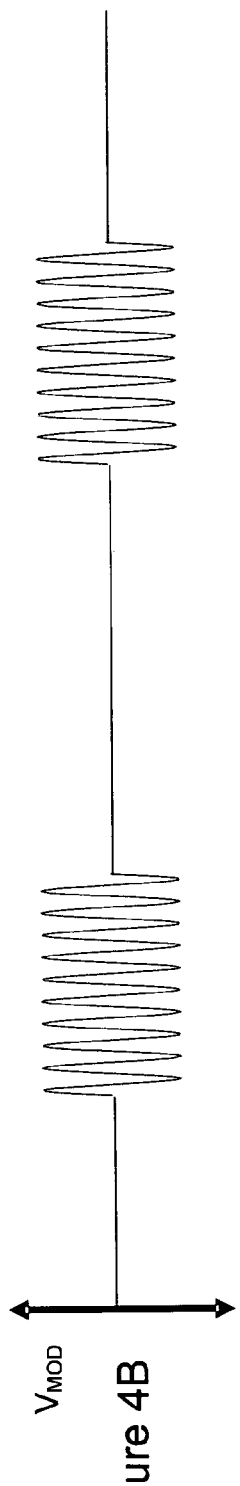
Figure 4C:
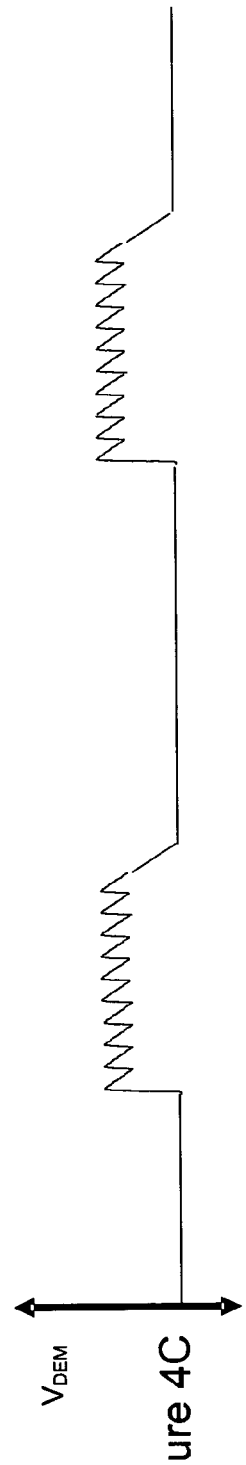
Figure 4D:
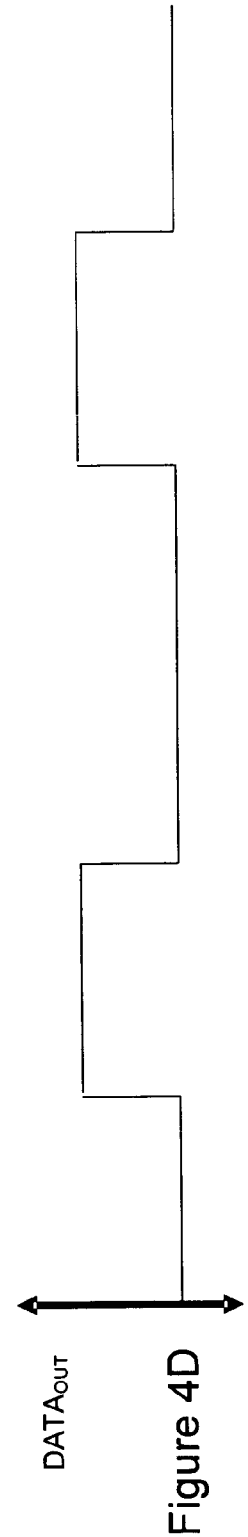

FIGS. 4A-4D illustrate signals at various points in the acoustic data coupler 100 and will now be utilized to describe the overall operation of the acoustic data coupler. FIG. 4A shows an example the $DATA_{IN}$ signal, which represents the asynchronous data transitions between the logic "0" and "1" states received from one portion of a system that is to be transmitted via the acoustic data coupler 100 to a second portion of the system. When the $DATA_{IN}$ signal is low as depicted up to a time $t_1$, corresponding to a logic 0 state, the input buffer 104 drives the $V_{CNTRL}$ signal low, turning OFF the output signal from the oscillator 300. When turned OFF, the oscillator 300 output drives the $V_{MOD}$ signal to a steady state DC or unmodulated signal as shown in FIG. 4B, which results in the $V_{TRAN}$, $V_{DEM}$, and $DATA_{OUT}$ signals responding as a steady state DC or unmodulated signal as well as shown in FIGS. 4C and 4D for the $V_{DEM}$, and $DATA_{OUT}$ signals.

When the $DATA_{IN}$ signal goes high at the time $t_1$ indicating a logic 1 state, the output of the oscillator 300 turns ON and outputs the sinusoidal oscillating signal as the $V_{MOD}$ signal, which is shown in FIG. 4B. In response to the $V_{MOD}$ signal, the acoustic isolation transformer 102 develops the $V_{TRAN}$ signal, where the value of the $V_{TRAN}$ signal relative to the $V_{MOD}$ signal depends upon the particular embodiment of the acoustic isolation transformer being utilized. The receiver 108 of FIG. 3, which is designated a demodulator/detector, receives the $V_{TRAN}$ signal from the acoustic isolation transformer 102 and demodulates this signal to generate the $V_{DEM}$ signal as shown in FIG. 4C.

In the example of FIG. 4C, the demodulator/detector 108 is an amplitude modulation detector utilizing a rectifier (not shown). Accordingly, the demodulator/detector 108 drives the $V_{DEM}$ signal to a high value in response to each positive-going portion of the $V_{MOD}$ signal and the $V_{DEM}$ signal decays from this high value during each negative-going portion of the $V_{MOD}$ signal. The $V_{DEM}$ signal output from the demodulator/detector 108 in this situation will simply be referred to as the high $V_{DEM}$ in the following description. In response to the high $V_{DEM}$ signal, the output buffer 110 drives the $DATA_{OUT}$ signal high as shown in FIG. 4D. As can be seen by comparing FIGS. 4A and 4D, the initial low-to-high transition of the $DATA_{IN}$ signal results in a corresponding low-to-high transition of the $DATA_{OUT}$ signal. To simplify FIGS. 4A-4D, these figures do not show delays between signals that inherently exist during operation of the data coupler 100, as will be appreciated by those skilled in the art. For example, although not shown in FIGS. 4A-4D a delay exists between the low-to-high transition of the $DATA_{IN}$ signal at time $t_1$ and the corresponding low-to-high transition of the $DATA_{OUT}$ signal. As long as the $DATA_{IN}$ signal is high, the output from the oscillator 300 is applied as the $V_{MOD}$ signal to the acoustic isolation transformer 102, resulting in the high $V_{DEM}$ signal and high $DATA_{OUT}$ signal as shown in FIGS. 4C and 4D.

As shown in FIG. 4A, at a time $t_2$ the $DATA_{IN}$ signal goes low indicating a return to the logic 0 state. In response to the low $DATA_{IN}$ signal and the corresponding low $V_{CNTRL}$ signal, the output of oscillator 300 turns OFF, causing the $V_{MOD}$ signal to return to the steady state DC or unmodulated signal as shown in FIG. 4B. The acoustic isolation transformer 102 drives the $V_{TRAN}$ signal to a steady state output in response to the $V_{MOD}$ signal, and in response to the $V_{TRAN}$ signal the demodulator/detector 108 drives the $V_{DEM}$ signal low as shown in FIG. 4C. In response to the low $V_{DEM}$ signal, the output buffer 110 drives the $DATA_{OUT}$ signal low. Once again, comparing FIGS. 4A and 4D illustrates that the high-to-low transition of the $DATA_{IN}$ signal results in a corresponding high-to-low transition of the $DATA_{OUT}$ signal in the acoustic data coupler 100 of FIG. 3.

FIGS. 5A-5D are signal diagrams illustrating the modulated signal $V_{MOD}$ developed by the transmitter 106 of FIG. 1 according to different respective embodiments of the present invention. More specifically, FIG. 5A illustrates an example of the $DATA_{IN}$ signal and FIGS. 5B-5D illustrate corresponding values for the $V_{MOD}$ signal for various modulation techniques implemented by the transmitter 106 of FIG. 1. FIG. 5B illustrates the $V_{MOD}$ signal for On/Off Keying, as previously described with reference to FIGS. 3 and 4. FIG. 5C illustrates the $V_{MOD}$ signal generated by the transmitter 106 wherein the transmitter implements Frequency Shift Keying (FSK) modulation of the applied $V_{CNTRL}$ signal. Accordingly, when the $DATA_{IN}$ signal is low the $V_{MOD}$ signal is a sinusoidal signal having a first frequency and when the $DATA_{IN}$ signal transitions high at a time $t_1$ the $V_{MOD}$ signal transitions to a sinusoidal signal having a second frequency, with the second frequency being higher than the first frequency. The acoustic isolation transformer 102 generates the $V_{TRAN}$ signal responsive to the $V_{MOD}$ signal and the receiver 108 appropriately demodulates this signal to generate the $V_{DEM}$ signal. Thus, in this embodiment the receiver 108 is a demodulator for appropriately demodulating the FSK modulated $V_{TRAN}$ signal. Note that FSK modulation is one type of frequency modulation (FM), and in other embodiments of the acoustic data coupler 100 the transmitter 106 and receiver 108 implement other types of frequency modulation and demodulation.

FIG. 5D illustrates the $V_{MOD}$ signal generated by the transmitter 106 wherein the transmitter implements Amplitude Shift Keying (ASK) of the applied $V_{CNTRL}$ signal. Accordingly, when the $DATA_{IN}$ signal is low the $V_{MOD}$ signal is a sinusoidal signal having a first amplitude and when the $DATA_{IN}$ signal transitions high at a time $t_1$ the $V_{MOD}$ signal transitions to a sinusoidal signal having a second amplitude, with the second amplitude being greater than the first amplitude in the example of FIG. 5D. Once again, the acoustic isolation transformer 102 generates the $V_{TRAN}$ signal corresponding to the $V_{MOD}$ signal and the receiver 108 appropriately demodulates the ASK modulated $V_{TRAN}$ signal to generate the $V_{DEM}$ signal. In this embodiment, the receiver 108 is an ASK demodulator. Amplitude Shift Keying is one type of amplitude modulation (AM), and in other embodiments of the acoustic data coupler 100 the transmitter 106 and receiver 108 implement other types of amplitude modulation and demodulation.

Additional embodiments of the transmitter 106 and receiver 108 are of course possible, such as a phase shift modulation embodiment for example, with an additional reference phase channel possibly being required for asynchronous data or synchronous data being communicated in such a phase modulation embodiment, as will be appreciated by those skilled in the art. Other types of modulation techniques can be implemented by the transmitter 106 and receiver 108 as will in still other embodiments of the acoustic data coupler 100. Some of these embodiments may, of course, require the communication of synchronous data rather than asynchronous data. In other embodiments, the transmitter 106 and receiver 108 implement quadrature amplitude modulation (QAM), orthogonal frequency division multiplexing (OFDM), discrete multi-tone (DMT), Code Division Multiple Access (CDMA), Gaussian Minimum Shift Keying (GMSK), as well as other types of known or future developed modulation techniques. Those skilled in the art will understand suitable circuitry for forming the transmitter 106 and receiver 108 to perform the required modulation and demodulation in these various embodiments, and thus, for the sake of brevity, such circuitry will not be described in more detail. As will be understood by those skilled in the art, some of these modulation schemes may be relatively complex and therefore relatively expensive to implement compared to other embodiments and to the typical requirements of data couplers.

Figure 6:
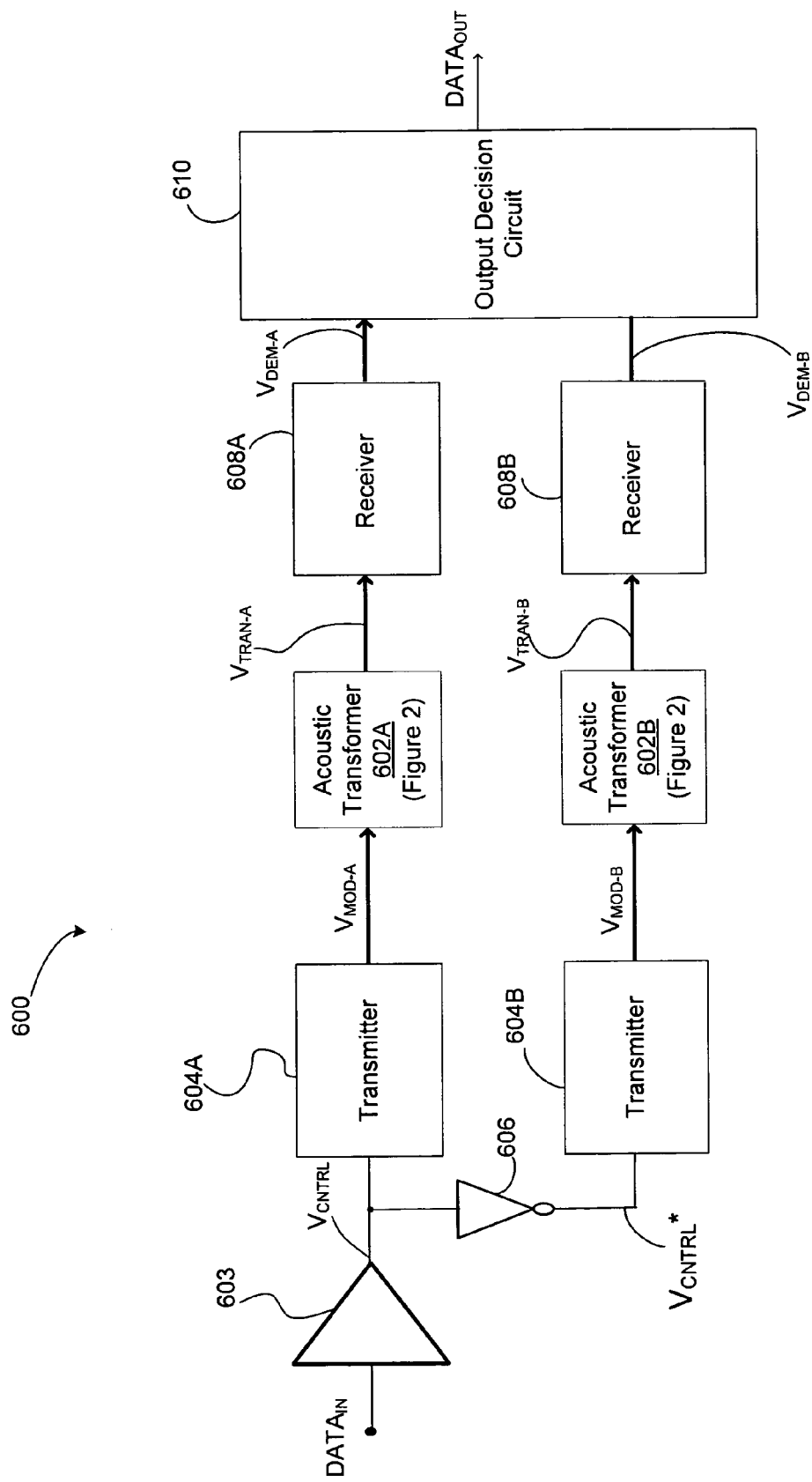
FIG. 6 is a functional block diagram of a dual path acoustic data coupler including two acoustic isolation transformers of FIG. 2 according to another embodiment of the present invention.

FIG. 6 is a functional block diagram of a dual path acoustic data coupler 600 according to another embodiment of the present invention. The dual path acoustic data coupler 600 includes two acoustic isolation transformers 602A and 602B, each such acoustic isolation transformer corresponding to the acoustic isolation transformer 200 of FIG. 2. The acoustic data coupler 600 is essentially a differential version of the acoustic data coupler 100 of FIG. 3. An input buffer 603 receives a data input signal $DATA_{IN}$ and generates an input control signal $V_{CNTRL}$ that is applied to a first transmitter 604A. In response to the input control signal $V_{CNTRL}$, the first transmitter 604A generates a first modulated signal $V_{MOD-A}$ which is applied to the acoustic isolation transformer 602A. The input control signal $V_{CNTRL}$ is also applied through an inverter 606 to generate a complementary input control signal $V_{CNTRL}{}^*$. The complementary input control signal $V_{CNTRL}{}^*$ is applied to a second transmitter 604B which generates a second modulated signal $V_{MOD-B}$ that is applied to the acoustic isolation transformer 602B. The $V_{CNTRL}$ and $V_{CNTRL}{}^*$ signals are complementary signals, meaning one signal is electrically inverted relative to the other and such as, for example, in the case of digital signals where one signal is the inverse of the other (i.e., when the $V_{CNTRL}$ is high the $V_{CNTRL}{}^*$ signal is low, and vice versa).

The acoustic isolation transformer 602A generates a first transformer output signal $V_{TRAN-A}$ in response to the first modulated signal $V_{MOD-A}$ and the acoustic isolation transformer 602B generates a second transformer output signal $V_{TRAN-B}$ in response to the second modulated signal $V_{MOD-B}$. A first receiver 608A demodulates the first transformer output signal $V_{TRAN-A}$ to generate a first demodulated output signal $V_{DEM-A}$ while a second receiver 608B demodulates the second transformer output signal $V_{TRAN-B}$ to generate a second demodulated output signal $V_{DEM-B}$. The first and second demodulated output signals $V_{DEM-A}$ and $V_{DEM-B}$ together represent the differential output of the acoustic data coupler 600. An output decision circuit 610 receives the first and second demodulated signals $V_{DEM-A}$ and $V_{DEM-B}$ and generates a data output signal $DATA_{OUT}$ in response to the demodulated signals. The $DATA_{OUT}$ signal corresponds to the $DATA_{IN}$ signal but is electrically isolated from circuitry supplying the $DATA_{IN}$ signal due to the acoustic isolation transformers 602A and 602B.

Figure 7:
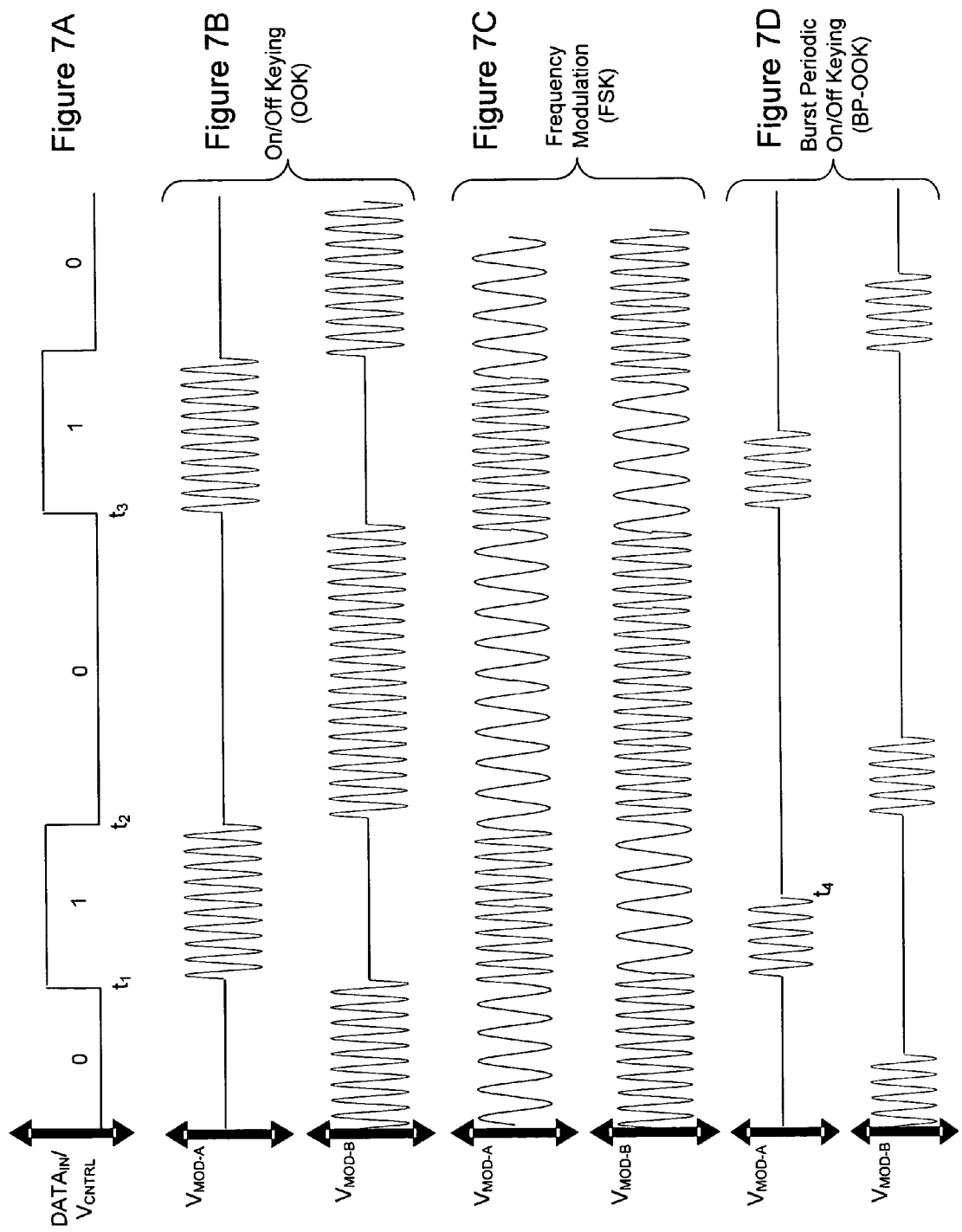
FIGS. 7A-7D are signal diagrams illustrating periodic modulated signals developed by the transmitters in the dual path acoustic data coupler of FIG. 6 according to respective embodiments of the present invention.

The operation of several embodiments of the acoustic data coupler 600 will now be described in more detail with reference to the signal diagrams of FIGS. 7A-7D. FIGS. 7A-7D are signal diagrams illustrating embodiments where the modulated signals $V_{MOD-A}$ and $V_{MOD-B}$ developed by the transmitters 604A and 604B are different types of periodic modulated signals, as will now be described in more detail. FIG. 7A illustrates an example of the $DATA_{IN}$ signal, which represents asynchronous data consisting of transitions between logic states "0" and "1" received from one portion of a system that is to be transmitted via the acoustic data coupler 600 to a second portion of the system. The $V_{CNTRL}$ signal corresponds to the $DATA_{IN}$ signal, ignoring any delay and distortion introduced by the input buffer 603, and thus the signal in FIG. 7A also indicates the $V_{CNTRL}$ signal.

The signal diagrams illustrated in FIG. 7B illustrate the modulated signals $V_{MOD-A}$ and $V_{MOD-B}$ in an On/Off-Keying (OOK) embodiment of the data coupler 600. In this embodiment, the transmitters 604A and 604B generate continuous periodic signals for the $V_{MOD-A}$ and $V_{MOD-B}$ signals responsive to rising and falling edges, respectively, of the $DATA_{IN}$ signal. Each transmitter 604A and 604B operates essentially the same way as previously described for the transmitter 106 of FIG. 3. More specifically, in response to the rising edge of the $DATA_{IN}/V_{CNTRL}$ signals at time $t_1$ the transmitter 604A develops the sinusoidal modulated signal $V_{MOD-A}$ as shown in the top signal diagram of FIG. 7B. Notice that also at time $t_1$, the inverter 606 generates a falling edge for the $V_{CNTRL}{}^*$ (FIG. 6) signal in response to the rising edge of the $V_{CNTRL}$ signal. In response to the falling edge of the $V_{CNTRL}{}^*$ signal, the transmitter 604B stops generating the sinusoidal modulated signal $V_{MOD-B}$ at time $t_1$ and simply drives the $V_{MOD-B}$ signal to a steady state DC or unmodulated level.

As seen in FIG. 7B, the transmitters 604A and 604B operate in a complementary manner. In response to a rising edge of the $V_{CNTRL}$ signal, the transmitter 604A generates the sinusoidal modulated signal $V_{MOD-A}$ while the transmitter 604B terminates generation of the sinusoidal modulated signal $V_{MOD-B}$. At a time $t_2$, in response to a falling edge of the $V_{CNTRL}$ signal, the transmitter 604A terminates generation of the sinusoidal modulated signal $V_{MOD-A}$ while the transmitter 604B initiates generation of the sinusoidal modulated signal $V_{MOD-B}$ responsive to the rising edge of the $V_{CNTRL}{}^*$ signal at time $t_2$. The transmitter 604B generates the sinusoidal modulated signal $V_{MOD-B}$ until a time $t_3$ at which a rising edge of the $DATA_{IN}/V_{CNTRL}$ signal occurs, at which point the transmitter 604B terminates generation of the sinusoidal output signal $V_{MOD-B}$ and the transmitter 604A again initiates generation of the $V_{MOD-A}$ signal.

Referring now to FIGS. 6 and 7B, with this On/Off-Keying embodiment of the acoustic data coupler 600 the first and second receivers 608A and 608B contain suitable demodulation circuitry to demodulate the complementary sinusoidal transformer output signals $V_{TRAN-A}$ and $V_{TRAN-B}$ generated by the acoustic isolation transformers 602A and 602B in response to the $V_{MOD-A}$ and $V_{MOD-B}$ signals. For example, the receivers 608A and 608B could in this embodiment include an amplifier coupled to a series connected diode and capacitor (not shown), with the voltage developed across the capacitor corresponding to either the $V_{DEM-A}$ or $V_{DEM-B}$ signals. In response to the $V_{DEM-A}$ and $V_{DEM-B}$ signals, the output decision circuit 610 generates the $DATA_{OUT}$ signal. Note that the output decision circuit 610 could actually use the information of either the $V_{DEM-A}$ or $V_{DEM-B}$ signal to generate the DATAOUT signal. In this situation, the output decision circuit 610 utilizes both $V_{DEM-A}$ or $V_{DEM-B}$ signals to determine the data coupler 600 is operating properly when these signals have opposite states to flag an error condition when these signals have the same state.

The signal diagrams illustrated in FIG. 7C illustrate the modulated signals $V_{MOD-A}$ and $V_{MOD-B}$ in a frequency shift keying (FSK) embodiment of the data coupler 600. In this embodiment, the transmitters 604A and 604B generate complementary frequency modulated signals for the $V_{MOD-A}$ and $V_{MOD-B}$ signals responsive to rising and falling edges, respectively, of the $DATA_{IN}$ signal. As shown in FIG. 7C, in response to the rising edge of the $DATA_{IN}/V_{CNTRL}$ signals at time $t_1$ the transmitter 604A develops the sinusoidal modulated signal $V_{MOD-A}$ having a first frequency as shown in the top signal diagram of FIG. 7C. Also at time $t_1$, the inverter 606 generates a falling edge for the $V_{CNTRL}$* signal in response to the rising edge of the $V_{CNTRL}$ signal. In response to the falling edge of the $V_{CNTRL}$* signal, the transmitter 604B starts generating the sinusoidal modulated signal $V_{MOD-B}$ having a second frequency, with the first frequency being greater than the second frequency in the example of FIG. 7C.

FIG. 7C illustrates that the transmitters 604A and 604B once again operate in a complementary manner. In response to a rising edge of the $V_{CNTRL}$ signal, the transmitter 604A generates the sinusoidal modulated signal $V_{MOD-A}$ having the first frequency while the transmitter 604B generates the sinusoidal modulated signal $V_{MOD-B}$ having the second frequency. At time $t_2$, in response to a falling edge of the $V_{CNTRL}$ signal, the transmitter 604A terminates generation of the sinusoidal modulated signal $V_{MOD-A}$ having the first frequency and initiates generation of the $V_{MOD-A}$ signal having the second frequency. Also at time $t_2$, the transmitter 604B initiates generation of the sinusoidal modulated signal $V_{MOD-B}$ having the first frequency and terminates generation of this signal having the second frequency. The transmitter 604B generates the sinusoidal modulated signal $V_{MOD-B}$ having the first frequency until time $t_3$ at which a rising edge of the $DATA_{IN}/V_{CNTRL}$ signal occurs, at which point the transmitter 604B terminates generation of the sinusoidal modulated signal $V_{MOD-B}$ having the first frequency and initiates generation of this signal having the second frequency. Also at time $t_3$, the transmitter 604A again initiates generation of the $V_{MOD-A}$ signal having the first frequency.

In this embodiment of the acoustic data coupler 600, the first and second receivers 608A and 608B once again contain suitable demodulation circuitry to demodulate the complementary sinusoidal transformer output signals $V_{TRAN-A}$ and $V_{TRAN-B}$ generated by the acoustic isolation transformer 102 in response to the $V_{MOD-A}$ and $V_{MOD-B}$ signals. Each receiver 608A and 608B would, for example, develop a first voltage for the $V_{DEM-A}$ and $V_{DEM-B}$ signal in response to the corresponding $V_{TRAN-A}$ and $V_{TRAN-B}$ signal having the first frequency and develop a second voltage for the $V_{DEM-A}$, $V_{DEM-B}$ signal in response to the corresponding $V_{TRAN-A}$, $V_{TRAN-B}$ signal having the second frequency. In response to the $V_{DEM-A}$, $V_{DEM-B}$ signals having the first and second frequencies, the output decision circuit 610 develops the $DATA_{OUT}$ signal indicating a first logic state. The output decision circuit 610 develops the $DATA_{OUT}$ signal indicating the complementary logic state when the $V_{DEM-A}$, $V_{DEM-B}$ signals have the second and first frequencies, respectively.

FIG. 7D illustrates signal diagrams of the modulated signals $V_{MOD-A}$ and $V_{MOD-B}$ in a Burst Periodic On/Off-Keying (BP-OOK) embodiment of the acoustic data coupler 600 of FIG. 6. In this embodiment, the transmitters 604A and 604B generate burst periodic signals for the $V_{MOD-A}$ and $V_{MOD-B}$ signals responsive to rising and falling edges, respectively, of the $DATA_{IN}/V_{CNTRL}$ signal. In contrast to the OOK embodiment previously described with reference to FIG. 7B, the transmitters 604A and 604B generate "burst periodic" signals for the $V_{MOD-A}$ and $V_{MOD-B}$ signals in the embodiment of FIG. 7D. Each $V_{MOD-A}$ and $V_{MOD-B}$ signal is burst periodic since the signal is periodic—a sinusoidal signal in the example of FIG. 7D—and is a burst signal since the duration of the signal is less than the duration to the next transition of the $DATA_{IN}/V_{CNTRL}$ signal. For example, the transmitter 604A starts generating the periodic $V_{MOD-A}$ signal at time $t_1$ in response to the rising edge of the $DATA_{IN}/V_{CNTRL}$ signal. This periodic $V_{MOD-A}$ signal is a burst that terminates at a time $t_4$, where the duration $(t_4-t_1)$ of the burst is less than the duration $(t_2-t_1)$ where the next transition of the $DATA_{IN}/V_{CNTRL}$ signal is at time $t_2$. The transmitter 604B operates in the same way to generate periodic bursts of duration $(t_4-t_1)$ in response to falling edges of the $DATA_{IN}/V_{CNTRL}$ signal, which corresponds to a rising edge of the $V_{CNTRL}$* signal.

Where the $V_{MOD-A}$ and $V_{MOD-B}$ signals are burst periodic signals, the corresponding $V_{TRAN-A}$ and $V_{TRAN-B}$ will similarly be burst periodic signals. The receivers 608A and 608B would typically generate burst $V_{DEM-A}$ and $V_{DEM-B}$ signals that are applied to the output decision circuit 610. Since the duration of these burst $V_{DEM-A}$ and $V_{DEM-B}$ signals are by definition shorter than the time until the next transition of the $DATA_{IN}/V_{CNTRL}$ signal, the output decision circuit 610 must latch the states of the $V_{DEM-A}$ and $V_{DEM-B}$ signals to maintain the $DATA_{OUT}$ signal at the desired level for the required time. For example, in FIG. 7D the burst of the $V_{MOD-A}$ signal terminates at time $t_4$ but the output decision circuit 610 must maintain the $DATA_{OUT}$ signal at the level corresponding to this burst until the time $t_2$. In one embodiment, the output decision circuit 610 is an RS latch receiving the burst $V_{DEM-A}$ signal on a reset input and the $V_{DEM-B}$ signal on a set input. In response to the $V_{DEM-A}$ and $V_{DEM-B}$ signals, the RS latch latches the $DATA_{OUT}$ signal at the corresponding level. Such a latching function must be performed by either the receivers 608A and 608B or the output decision circuit 610 where the transmitters 604A and 604B generate burst signals.

The burst periodic embodiment of FIG. 7D reduces the overall power consumption of the acoustic data coupler 600 when compared to the OOK and FSK embodiments previously described for FIGS. 7B and 7C. One skilled in the art will understand suitable demodulation circuitry for forming the first and second receivers 608A and 608B to demodulate the complementary burst sinusoidal transformer output signals $V_{TRAN-A}$ and $V_{TRAN-B}$ generated by the acoustic isolation transformers 602A and 602B in response to the burst periodic $V_{MOD-A}$ and $V_{MOD-B}$ signals.

Figure 8:
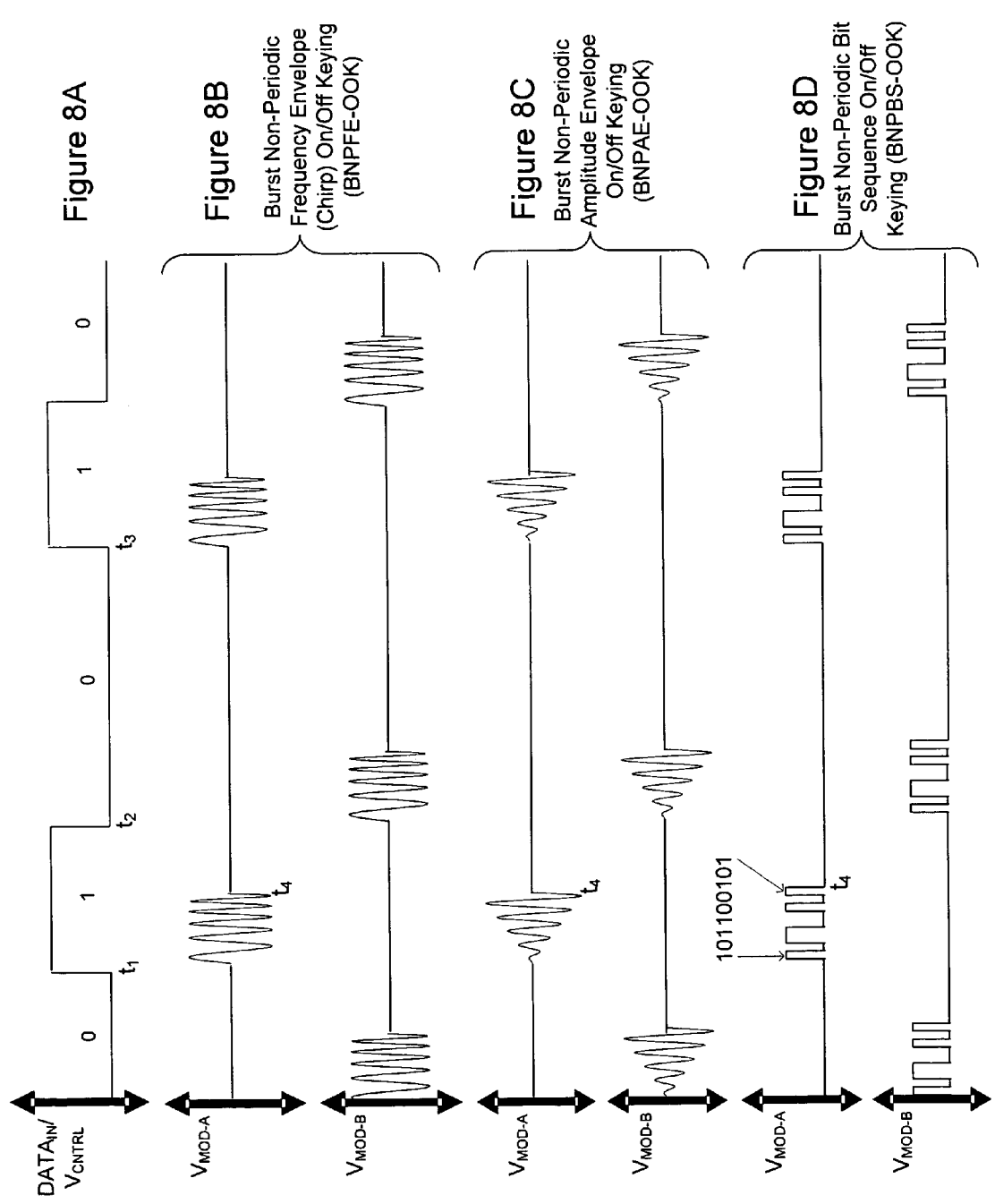
FIGS. 8A-8D are signal diagrams illustrating nonperiodic burst modulated signals developed by the transmitters in the dual path acoustic data coupler of FIG. 6 according to further respective embodiments of the present invention.

The operation of several nonperiodic burst signaling embodiments of the acoustic data coupler 600 will now be described in more detail with reference to the signal diagrams of FIGS. 8A-8D, which illustrate embodiments of the acoustic data coupler where the modulated signals $V_{MOD-A}$ and $V_{MOD-B}$ developed by the transmitters 604A and 604B are different types of nonperiodic burst modulated signals. FIG. 8A illustrates an example of the $DATA_{IN}$ signal, which represents the asynchronous data transitions between logic "0" and logic "1" states received from one portion of a system that is to be transmitted via the acoustic data coupler 600 to a second portion of the system. Once again, the $V_{CNTRL}$ signal corresponds to the $DATA_{IN}$ signal, ignoring any delay and distortion introduced by the input buffer 603, and thus the signal in FIG. 8A also indicates the $V_{CNTRL}$ signal.

The signal diagrams illustrated in FIG. 8B illustrate the modulated signals $V_{MOD-A}$ and $V_{MOD-B}$ in a Burst Nonperiodic Frequency Envelope On/Off-Keying (BNPFE-OOK) embodiment of the data coupler 600. In this embodiment, the transmitters 604A and 604B generate burst nonperiodic signals for the $V_{MOD-A}$ and $V_{MOD-B}$ signals responsive to rising and falling edges, respectively, of the $DATA_{IN}$ signal. Each nonperiodic signal for the $V_{MOD-A}$ and $V_{MOD-B}$ signal has a frequency envelope, meaning the signal varies in frequency as a function of time over the duration of the signal burst. In the example of FIG. 8B, the frequency of each burst nonperiodic $V_{MOD-A}$ and $V_{MOD-B}$ signal varies from a lower frequency at the start of the burst to a higher frequency at the end of the burst. Such signals for the $V_{MOD-A}$ and $V_{MOD-B}$ signals may also be referred to "chirps," as will be appreciated by those skilled in the art.

Each transmitter 604A and 604B operates essentially the same way as previously described for the embodiment of FIG. 7D except that the transmitters generate the burst nonperiodic frequency envelope On/Off Keying (BNPFE-OOK) $V_{MOD-A}$ and $V_{MOD-B}$ signals. More specifically, in response to the rising edge of the $DATA_{IN}/V_{CNTRL}$ signals at a time $t_1$ the transmitter 604A develops the BNPFE-OOK signal $V_{MOD-A}$ as shown in the top signal diagram of FIG. 8B. Notice that also at time $t_1$, the inverter 606 generates a falling edge for the $V_{CNTRL}*$ signal in response to the rising edge of the $V_{CNTRL}$ signal. In response to the falling edge of the $V_{CNTRL}*$ signal, the transmitter 604B maintains the $V_{MOD-B}$ at a steady state DC or unmodulated level at time $t_1$.

In this embodiment, the transmitters 604A and 604B generate BNPFE-OOK signals for the $V_{MOD-A}$ and $V_{MOD-B}$ signals responsive to rising and falling edges, respectively, of the $DATA_{IN}/V_{CNTRL}$ signal. In response to the falling edge of the $DATA_{IN}/V_{CNTRL}$ signal at a time $t_2$, which corresponds to a rising edge of the $V_{CNTRL}*$ signal, the transmitter 604B develops the BNPFE-OOK signal $V_{MOD-B}$ as shown in the bottom signal diagram of FIG. 8B. At a time $t_3$, the $DATA_{IN}/V_{CNTRL}$ signal again goes high, causing the transmitter 604A to generate the BNPFE-OOK signal $V_{MOD-A}$. Once again, each generated $V_{MOD-A}$ and $V_{MOD-B}$ signal is a burst signal since the duration of the signal is less than the duration to the next transition of the $DATA_{IN}/V_{CNTRL}$ signal, as shown from time $t_1$ to a time $t_4$ for the $V_{MOD-A}$ signal, where the duration $(t_4-t_1)$ of the burst is less than the duration $(t_2-t_1)$ until the next transition of the $DATA_{IN}/V_{CNTRL}$ signal at time $t_2$. Moreover, each generated $V_{MOD-A}$ and $V_{MOD-B}$ signal is a burst nonperiodic signal, where a periodic signal F is mathematically defined by $F=F(t-\tau)$ where $\tau$ is the period of the signal. The $V_{MOD-A}$ and $V_{MOD-B}$ signals having varying frequencies do not satisfy such a relationship and thus are not periodic. The receivers 608A and 608B (FIG. 6) would once again contain suitable circuitry for demodulating the BNPFE-OOK $V_{TRAN-A}$ and $V_{TRAN-B}$ signals generated by the acoustic isolation transformers 602A and 602B in response to the BNPFE-OOK $V_{MOD-A}$ and $V_{MOD-B}$ signals, and the output decision circuit 610 would again contain suitable circuitry for latching the $DATA_{OUT}$ signal at the appropriate level in response to the burst $V_{DEM-A}$ and $V_{DEM-B}$ signals.

FIG. 8C illustrates signal diagrams where the modulated signals $V_{MOD-A}$ and $V_{MOD-B}$ are Burst Nonperiodic Amplitude Envelope On/Off-keying (BNPAE-OOK) signals according to another embodiment of the data coupler 600. This embodiment is similar to the BNPFE-OOK just described with reference to FIG. 8C except that the amplitude instead of the frequency of the burst $V_{MOD-A}$ and $V_{MOD-B}$ signals varies over the duration of the burst. FIG. 8D illustrates signal diagrams where the modulated signals $V_{MOD-A}$ and $V_{MOD-B}$ are Burst Nonperiodic Bit Sequence On/off-keying (BNPBS-OOK) signals according to a further embodiment of the data coupler 600. From the start of any of these bit sequences, such as at the time $t_1$ for the VMOD-A signal in FIG. 8D, the sequence is nonperiodic over the duration of the signal to the time $t_4$. For either of the embodiments of FIGS. 8C and 8D, the receivers 608A and 608B would again contain suitable circuitry for demodulating the BNPAE-OOK and BNPBS-OOK $V_{TRAN-A}$ and $V_{TRAN-B}$ signals generated by the acoustic isolation transformers 602A and 602B in response to the BNPAE-OOK and BNPBS-OOK $V_{MOD-A}$ and $V_{MOD-B}$ signals, and the output decision circuit 610 would again contain suitable circuitry for latching the $DATA_{OUT}$ signal at the appropriate level in response to the burst nonperiodic $V_{DEM-A}$ and $V_{DEM-B}$ signals.

Although FIGS. 8B-8D illustrate particular burst nonperiodic examples for the signals VMOD-A and VMOD-B, these are merely examples and one skilled in the art will appreciate that other burst nonperiodic signals could be utilized in alternative embodiments of the acoustic data coupler 600. Moreover, in alternative embodiments of the present invention, a different type of isolation transformer, such as a capacitive or magnetic transformer, is utilized in place of the acoustic isolation transformer 102 in the data couplers 100 and 600 of FIGS. 1 and 6. In such an embodiment, the transmitters 106, 604 generate nonperiodic signals that are applied through the different type of isolation transformer to the receivers 108, 608.

In another embodiment of the acoustic data coupler 100 of FIG. 1, the coupler includes only a single data path including the single transmitter 106, acoustic isolation transformer 102, and receiver 108, and the transmitter generates a burst periodic modulated signal $V_{MOD}$. The data input signal $DATA_{IN}$ is applied through the input buffer 104 to generate the input control signal $V_{CNTRL}$ that is applied to the transmitter 106. In response to $V_{CNTRL}$ signal, the transmitter 106 generates the burst periodic modulated signal $V_{MOD}$, where this burst periodic signal is similar to the burst periodic signals previously discussed with reference to FIG. 7D.

In one embodiment, when the $V_{CNTRL}$ signal transitions from a first level to a second level responsive to a corresponding transition of the $DATA_{IN}$ signal, the transmitter 106 generates the $V_{MOD}$ signal having a first frequency. When the $V_{CNTRL}$ signal transitions from the second level to the first level responsive to a corresponding transition of the $DATA_{IN}$ signal, the transmitter 106 generates the $V_{MOD}$ signal having a second frequency that is different from the first frequency. The acoustic isolation transformer 102 generates the transformer output signal $V_{TRAN}$ responsive to the burst periodic $V_{MOD}$ signal and the receiver 108 demodulates the transformer output signal to generate the demodulated signal $V_{DEM}$, which represents the transition of the original data input signal $DATA_{IN}$ applied to the transmitter 106. The output buffer 110 latches the $DATA_{OUT}$ signal in a particular state in response to the demodulated signal $V_{DEM}$. The $V_{DEM}$ signal will have a first value when the $V_{MOD}$ and $V_{TRAN}$ signals have the first frequency and will have a second value when the $V_{MOD}$ and $V_{TRAN}$ signals have the second frequency. In this embodiment, the transmitter 106 may occasionally transmit a "refresh pulse" in the form of the same burst periodic $V_{MOD}$ signal previously transmitted, which enables the receiver 108 to determine that the $DATA_{IN}$ has not changed state but the coupler 100 is still operating properly.

In an alternative embodiment, the coupler 100 operates in a similar manner as just described except that the transmitter 106 generates a burst nonperiodic modulated $V_{MOD}$ signal. When the $V_{CNTRL}$ signal transitions from a first level to a second level responsive to a corresponding transition of the $DATA_{IN}$ signal, the transmitter 106 generates the burst nonperiodic $V_{MOD}$ signal having a first profile. When the $V_{CNTRL}$ signal transitions from the second level to the first level responsive to a corresponding transition of the DATA$_{IN}$ signal, the transmitter 106 generates the $V_{MOD}$ signal having a second profile that is different from the first profile. For example, the first profile may correspond to the $V_{MOD-A}$ signal shown in FIG. 8B while the second profile may correspond to the $V_{MOD-A}$ signal shown in FIG. 8C. The first and second profiles must be sufficiently different to enable the receiver 108 to generate the $V_{DEM}$ having a first value when the $V_{MOD}$ and thus the $V_{TRAN}$ signals have the first profile and a second value when the $V_{MOD}$ and thus the $V_{TRAN}$ signals have the second profile.

Figure 9:
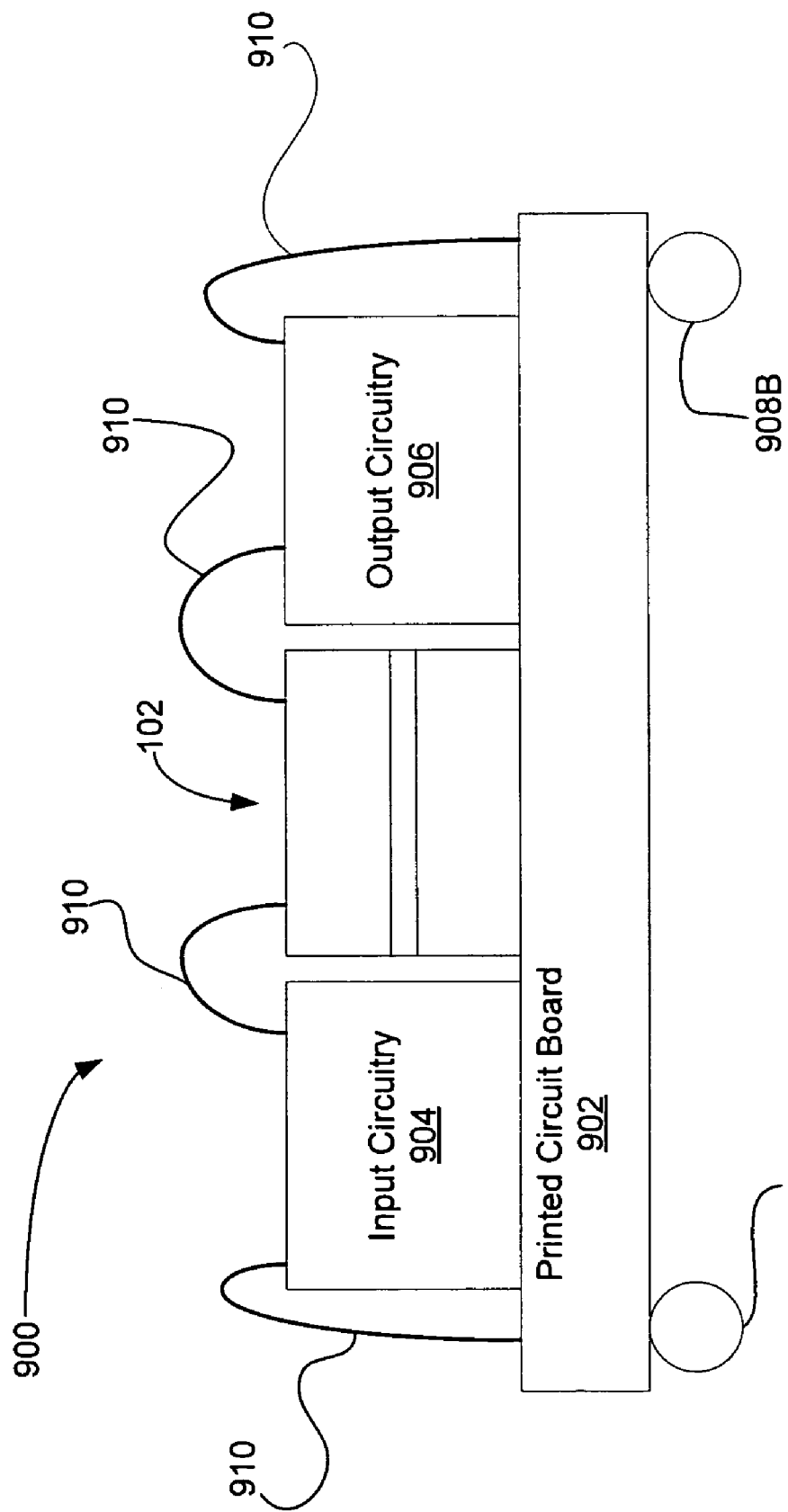
FIG. 9 is a simplified cross-sectional view of an acoustic data coupling device including the data coupler of FIG. 1 or 6 according to another embodiment of the present invention.

FIG. 9 is a simplified cross-sectional view of an acoustic data coupling device 900 including the acoustic data coupler 100 of FIG. 1 according to another embodiment of the present invention. The device 900 includes a substrate 902, which may be a printed circuit board, chip carrier, or any other suitable substrate, on which the acoustic isolation transformer 102 is mounted. Also mounted on the substrate 902 is input circuitry 904 including the input buffer 104 and transmitter 106 (FIG. 1) and output circuitry 906 including the receiver 108 and output buffer 100 (FIG. 1). In one embodiment, the substrate 902 includes conductive balls 908A and 908B that are electrically connected as required to the input circuitry 904 and the output circuitry 906, respectively, and which provide for electrical interconnection of the device 900 to external circuitry (not shown). Conductive wires 910 interconnect the input circuitry 904, acoustic isolation transformer 102, and output circuitry 906, and also interconnect the input and output circuitry to the substrate 902.

As previously mentioned, the substrate 902 may be any suitable type of substrate, such as a flip-chip board, and the entire device 900 may be encased or encapsulated as part of forming the device. Furthermore, the device 900 may include multiple data couplers 100, with some or all of these couplers corresponding to the data coupler 600 of FIG. 6. Moreover, some or all of the data couplers 100 and/or 600 may be data couplers that include isolation barriers other than the acoustic isolation transformer 102 and that communicate burst nonperiodic signals through such isolation barriers. Depending on the type of substrate 902, it should also be noted that the specific type of conductive interconnection will of course vary, with the conductive balls 908A and 908B being shown merely by way of example. In one embodiment, the substrate 902 is a semiconductor substrate including suitable conductor, semiconductor, and insulation layers in which components of the input circuitry 904, output circuitry 906, and acoustic isolation transformer 102 are formed.

The substrate 902 may be any suitable type of substrate including a printed circuit board or a semiconductor substrate in which at least some of the components of the input circuitry 904 and output circuitry 906 are formed. The substrate may be a silicon on insulator (SOI) substrate with suitable components formed in the silicon or may be a ceramic or other suitable type of insulating substrate. Any other suitable substrate may be utilized in forming the acoustic data coupling device 900.

Figure 10:
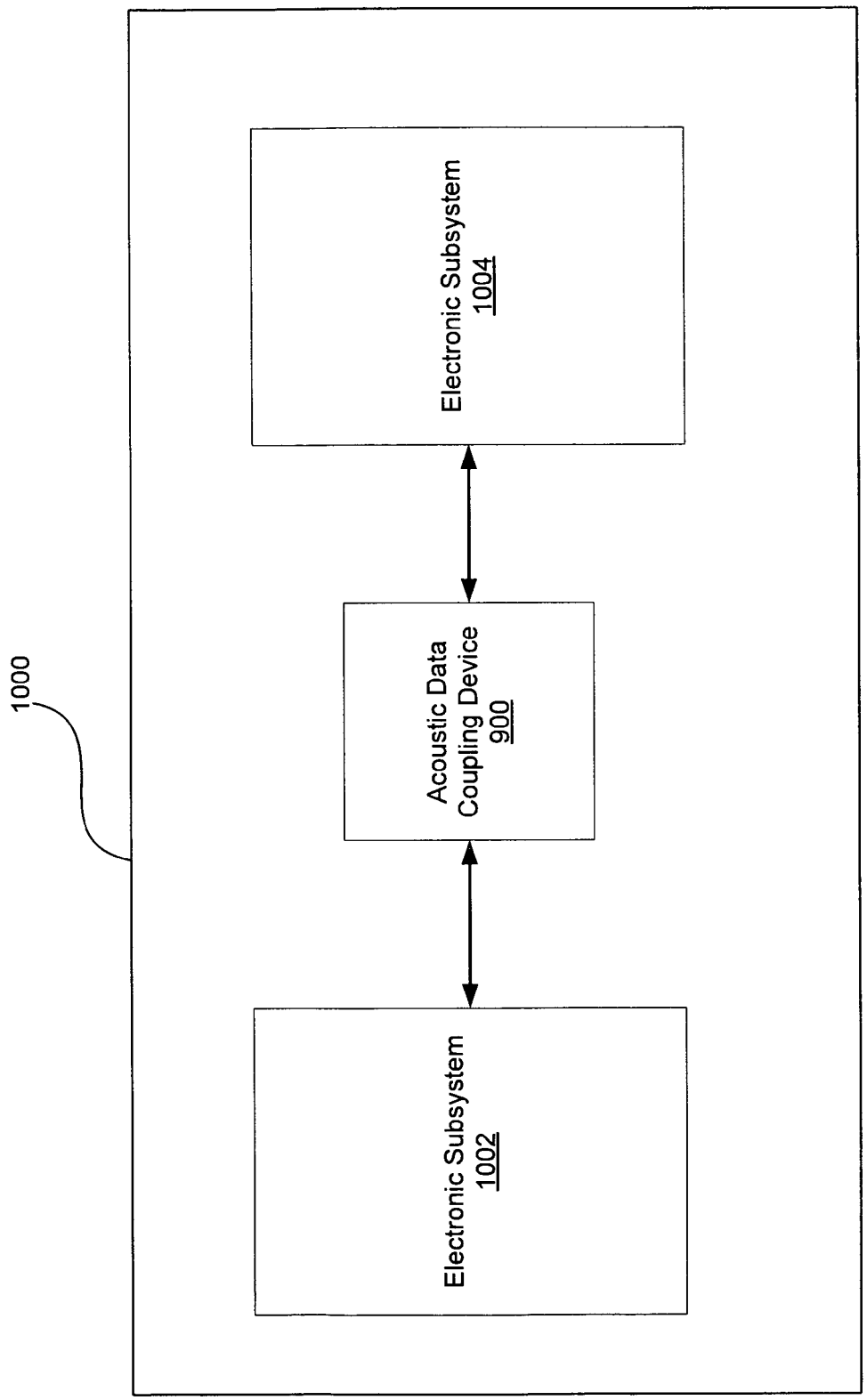
FIG. 10 is a functional block diagram of an electronic system including a plurality of the data coupling devices of FIG. 9 according to one embodiment of the present invention.

FIG. 10 is a functional block diagram of an electronic system 1000 including a plurality of the data coupling devices 900 of FIG. 9 according to one embodiment of the present invention. A first electronic subsystem 1002 includes circuitry for a first portion of the system 1000 and is connected to provide inputs to and receive outputs from the devices 900. A second electronic subsystem 1004 similarly includes circuitry for a second portion of the system 1000 and is connected to provide inputs to and receive outputs from the devices 900. The acoustic data coupling devices 900 thus include some devices having inputs connected to subsystem 1002 and outputs to subsystem 1004 and some devices coupled in the opposing direction, with inputs connected to subsystem 1004 and outputs to subsystem 1002.

During operation of the system 1000, the subsystem 1002 must be electrically isolated from the subsystem 1004. Accordingly, data signals developed in subsystem 1002 that must be communicated to subsystem 1004, which correspond to the DATA$_{IN}$ signals in FIG. 1, are via acoustic data coupling devices 900 coupled to receive DATA$_{IN}$ signals from the subsystem 1002 and to output corresponding DATA$_{OUT}$ signals to the subsystem 1004. Conversely, data signals developed in subsystem 1004 that must be communicated to subsystem 1002 are communicated via devices 900 coupled to receive DATA$_{IN}$ signals from the subsystem 1004 and provide corresponding DATA$_{OUT}$ signals to the subsystem 1002.

Even though various embodiments and advantages of the present invention have been set forth in the foregoing description, the above disclosure is illustrative only, and changes may be made in detail and yet remain within the broad principles of the present invention. Moreover, the functions performed by components in the embodiments may be combined to be performed by fewer elements, separated and performed by more elements, or combined into different functional blocks in other embodiments of the present invention, as will appreciated by those skilled in the art. Also, some of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A data coupler, comprising:
   a first acoustic isolation transformer operable to develop a first isolated output signal in response to a first modulated input signal;
   a second acoustic isolation transformer operable to develop a second isolated output signal in response to a second modulated input signal;
   a first transmitter coupled to the first acoustic isolation transformer and adapted to receive a first data input signal, the first transmitter operable to generate the first modulated input signal in response to the first data input signal;
   a second transmitter coupled to the second acoustic isolation transformer and adapted to receive a second data input signal that is the complement of the first data input signal, the second transmitter operable to generate the second modulated input signal in response to the second data input signal;
   a first receiver coupled to the first acoustic isolation transformer to receive the first isolated output signal and operable to generate a first demodulated signal responsive to the first isolated output signal; and a second receiver coupled to the second acoustic isolation transformer to receive the second isolated output signal and operable to generate a second demodulated signal responsive to the second isolated output signal; and
   an output decision circuit coupled to the first and second receivers to receive the first and second data output signals, the output decision circuit operable to generate a data output signal responsive to the first and second demodulated signals.

2. The data coupler of claim 1 wherein the first and second modulated signals generated by the transmitter each comprise a continuous periodic signal.

3. The data coupler of claim 2 wherein each continuous periodic signal comprises one of an On/Off Keying, Frequency Shift Keying, and Amplitude Shift Keying modulated signal.

4. The data coupler of claim 2 wherein each periodic signal comprises a burst periodic signal.

5. The data coupler of claim 2 wherein each periodic signal comprises a burst nonperiodic signal.

6. The data coupler of claim 2 wherein each burst nonperiodic signal comprises one of a Burst Nonperiodic Frequency Envelope On/Off Keying signal, Burst Nonperiodic Amplitude Envelope On/Off Keying signal, and Burst Nonperiodic Bit Sequence On/Off Keying signal.

7. The data coupler of claim 1 wherein each of the first and second acoustic isolation transformers comprises two stacked film bulk acoustic resonators.

8. The data coupler of claim 7 wherein each of the stacked film bulk acoustic resonators comprises a stacked pair of film bulk acoustic resonators having an acoustic coupling layer positioned between them.

9. The data coupler of claim 8 wherein a first one of the film bulk acoustic resonators in a first one of the pair is coupled in antiparallel with a first one of the film bulk acoustic resonators in a second one of the pair, and wherein a second one of the film bulk acoustic resonators in the first one of the pair is coupled in series with a second one of the film bulk acoustic resonators in the second one of the pair.

10. The data coupler of claim 1 wherein the data input signal comprises a digital signal.

11. The data coupler of claim 1 wherein the data coupler further comprises a substrate on which the first and second acoustic isolation transformers, transmitters, and receivers are carried.

12. The data coupler of claim 11 wherein the substrate comprises a printed circuit board.

13. The data coupler as claimed in claim 1, wherein the output decision circuit comprises an RS latch.

14. An electronic system, comprising:
a first electronic subsystem; a second electronic subsystem;
a substrate containing at least one data coupling device, each data coupling device being coupled to the first and second electronic subsystems and each data coupling device including, a first acoustic isolation transformer operable to develop a first isolated output signal in response to a first modulated input signal;
a second acoustic isolation transformer operable to develop a second isolated output signal in response to a second modulated input signal;
a first transmitter coupled to the first acoustic isolation transformer and adapted to receive a first data input signal, the first transmitter operable to generate the first modulated input signal in response to the first data input signal;
a second transmitter coupled to the second acoustic isolation transformer and adapted to receive a second data input signal that is the complement of the first data input signal, the second transmitter operable to generate the second modulated input signal in response to the second data input signal;
a first receiver coupled to the first acoustic isolation transformer to receive the first isolated output signal and operable to generate a first demodulated signal responsive to the first isolated output signal; and a second receiver coupled to the second acoustic isolation transformer to receive the second isolated output signal and operable to generate a second demodulated signal responsive to the second isolated output signal; and
an output decision circuit coupled to the first and second receivers to receive the first and second data output signals, the output decision circuit operable to generate a data output signal responsive to the first and second demodulated signals.

15. The electronic system of claim 14 wherein the first and second electronic subsystems comprise computer subsystems.

16. The electronic system of claim 14 wherein the modulated signal generated by the transmitter comprises a periodic signal.

17. The electronic system of claim 16 wherein the periodic signal comprises a burst periodic signal.

18. The electronic system of claim 14 wherein the modulated signal generated by the transmitter comprises a nonperiodic signal.

19. The electronic system of claim 18 wherein the nonperiodic signal comprises one of a Burst Nonperiodic Frequency Envelope On/Off Keying (BNPFE-OOK), Burst Nonperiodic Amplitude Envelope On/Off Keying (BNPAE-OOK), and Burst Nonperiodic Bit Sequence On/Off Keying (BNPBS-OOK) signal.

20. The electronic system of claim 14 wherein the substrate comprises a printed circuit board.

21. The electronic system as claimed in claim 14, wherein the output decision circuit comprises an RS latch.

* * * * *